US011900990B2

(12) United States Patent
Ramaraju

(10) Patent No.: US 11,900,990 B2
(45) Date of Patent: Feb. 13, 2024

(54) MEMORY DEVICE HAVING VARIABLE IMPEDANCE MEMORY CELLS AND TIME-TO-TRANSITION SENSING OF DATA STORED THEREIN

(71) Applicant: R&D 3 LLC, Round Rock, TX (US)

(72) Inventor: Ravindraraj Ramaraju, Round Rock, TX (US)

(73) Assignee: R&D3 LLC, Round Rock, TX (US)

( * ) Notice: Subject to any disclaimer, the term of this patent is extended or adjusted under 35 U.S.C. 154(b) by 0 days.

(21) Appl. No.: 18/046,142

(22) Filed: Oct. 12, 2022

(65) Prior Publication Data

US 2023/0059170 A1 Feb. 23, 2023

Related U.S. Application Data

(63) Continuation of application No. 17/105,927, filed on Nov. 27, 2020, now Pat. No. 11,501,826, which is a
(Continued)

(51) Int. Cl.
*G11C 16/30* (2006.01)
*G11C 11/4096* (2006.01)
(Continued)

(52) U.S. Cl.
CPC .......... *G11C 11/4096* (2013.01); *G11C 5/063* (2013.01); *G11C 7/065* (2013.01);
(Continued)

(58) Field of Classification Search
CPC ..... G11C 11/4096; G11C 5/063; G11C 7/065; G11C 7/08; G11C 7/14; G11C 7/18;
(Continued)

(56) References Cited

U.S. PATENT DOCUMENTS 6,128,239 A 10/2000 Perner
6,259,644 B1 7/2001 Tran et al.
(Continued)

FOREIGN PATENT DOCUMENTS

JP 2000293993 A 10/2000
JP 2001184856 A 7/2001
(Continued)

OTHER PUBLICATIONS

Office Action from the Japan Patent Office, Japanese Patent Application No. 2020-517140, dated Oct. 4, 2022, 7 pgs.
(Continued)

*Primary Examiner* — Xiaochun L Chen
(74) *Attorney, Agent, or Firm* — Gonzalez PLLC; Gabriel J. Gonzalez

(57) ABSTRACT

The present disclosure relates to circuits, systems, and methods of operation for a memory device. In an example, a memory device includes a memory array including a plurality of memory cells, each memory cell having an impedance that varies in accordance with a respective data value stored therein; and a tracking memory cell having an impedance based on a tracking data value stored therein; and a read circuit coupled to the memory array, the read circuit configured to determine an impedance of a selected memory cells with respect to the impedance of the tracking memory cell; read a data value stored within the selected memory cell based upon a voltage change of a signal node voltage corresponding to the impedance of the selected memory cell.

20 Claims, 19 Drawing Sheets

Related U.S. Application Data continuation-in-part of application No. 16/802,902, filed on Feb. 27, 2020, now Pat. No. 11,049,553, which is a continuation of application No. 16/359,948, filed on Mar. 20, 2019, now Pat. No. 10,629,256, which is a continuation of application No. 16/040,419, filed on Jul. 19, 2018, now Pat. No. 10,269,413.

(60) Provisional application No. 62/650,067, filed on Mar. 29, 2018, provisional application No. 62/573,460, filed on Oct. 17, 2017.

(51) Int. Cl.

| | | |
|---|---|---|
| *G11C 5/06* | (2006.01) | |
| *G11C 7/08* | (2006.01) | |
| *G11C 7/18* | (2006.01) | |
| *G11C 11/56* | (2006.01) | |
| *G11C 7/14* | (2006.01) | |
| *G11C 11/404* | (2006.01) | |
| *G11C 7/06* | (2006.01) | |
| *G11C 11/4091* | (2006.01) | |
| *G11C 11/4094* | (2006.01) | |
| *G11C 8/16* | (2006.01) | |
| *G11C 11/405* | (2006.01) | |

(52) U.S. Cl.
CPC .................. *G11C 7/08* (2013.01); *G11C 7/14* (2013.01); *G11C 7/18* (2013.01); *G11C 11/404* (2013.01); *G11C 11/4045* (2013.01); *G11C 11/4091* (2013.01); *G11C 11/565* (2013.01); *G11C 16/30* (2013.01); *G11C 8/16* (2013.01); *G11C 11/405* (2013.01); *G11C 11/4094* (2013.01); *G11C 2207/2254* (2013.01)

(58) Field of Classification Search
CPC .............. G11C 11/404; G11C 11/4045; G11C 11/4091; G11C 11/565; G11C 16/30; G11C 8/16; G11C 11/405; G11C 11/4094; G11C 2207/2254; G11C 7/1036; G11C 8/14; G11C 7/227; G11C 11/4076
See application file for complete search history.

(56) References Cited

U.S. PATENT DOCUMENTS

| | | |
|---|---|---|
| 2009/0073783 A1 | 3/2009 | Breitwisch et al. |
| 2009/0073784 A1 | 3/2009 | Breitwisch et al. |
| 2009/0073785 A1 | 3/2009 | Breitwisch et al. |
| 2009/0073790 A1 | 3/2009 | Breitwisch et al. |
| 2011/0075473 A1* | 3/2011 | Park .................. G11C 13/0038 365/210.11 |
| 2014/0043886 A1* | 2/2014 | Wu ........................ G11C 7/12 365/205 |
| 2016/0358648 A1 | 12/2016 | Park et al. |
| 2017/0294227 A1 | 10/2017 | Tezuka et al. |
| 2018/0075900 A1* | 3/2018 | Ishizu ...................... G11C 7/14 |
| 2022/0139440 A1* | 5/2022 | Fujiwara ............... G11C 11/405 365/149 |

FOREIGN PATENT DOCUMENTS

| | | |
|---|---|---|
| JP | 2002008369 A | 1/2002 |
| JP | 2016115385 A | 6/2016 |

OTHER PUBLICATIONS

Office Action from the Japan Patent Office, Japanese Patent Application No. 2020-516892, dated Oct. 4, 2022.

* cited by examiner

MEMORY DEVICE HAVING VARIABLE IMPEDANCE MEMORY CELLS AND TIME-TO-TRANSITION SENSING OF DATA STORED THEREIN

CROSS-REFERENCE TO RELATED APPLICATIONS

The present application is a continuation of U.S. application Ser. No. 17/105,927, titled "Memory Device Having Variable Impedance Memory Cells and Time-To-Transition Sensing of Data Stored Therein," filed Nov. 27, 2020, which is a continuation-in-part of U.S. application Ser. No. 16/802,902, titled "Memory Device Having Variable Impedance Memory Cells and Time-To-Transition Sensing of Data Stored Therein," filed Feb. 27, 2020, which is a continuation of U.S. patent application Ser. No. 16/359,948, titled "Memory Device Having Variable Impedance Memory Cells and Time-To-Transition Sensing of Data Stored Therein," filed Mar. 20, 2019 (now U.S. Pat. No. 10,629,256), which is a continuation of U.S. patent application Ser. No. 16/040,419, titled "Memory Device Having Variable Impedance Memory Cells and Time-To-Transition Sensing of Data Stored Therein," filed Jul. 19, 2018 (now U.S. Pat. No. 10,269,413), which claims the benefit of U.S. Provisional Patent Application No. 62/650,067, filed Mar. 29, 2018, titled "Memory Structures and Related Methods of Operation," and further claims the benefit of U.S. Provisional Patent Application No. 62/573,460, filed Oct. 17, 2017, titled "Memory Operation." All applications are incorporated herein by reference in their entirety.

TECHNICAL FIELD

The present disclosure relates to circuits, systems, and methods of operation for a memory device, and more particularly relates to devices whose memory cells have a variable impedance that varies in accordance with a respective data value stored therein.

BACKGROUND

Memory may be used for many different types of purposes in a computing system. For example, memory may be used to store data or perform mathematical operations. Different types of memory may be used for these various purposes. Dynamic random-access memory (DRAM) may be used in situations that benefit from low-cost and high-capacity memory, and may be used in main memory components of a computing system. DRAM may be slower than other kinds of memory such as static random-access memory (SRAM).

SUMMARY

Memory devices are disclosed that generally perform a time delay determination of a voltage change on a signal node to determine the data value stored within a selected memory cell.

In one disclosed embodiment, a memory device includes a plurality of memory cells, each memory cell having a variable impedance that varies in accordance with a respective data value stored therein. The memory device also includes a read circuit configured to read the data value stored within a selected memory cell based upon a variable time delay determination of a signal node voltage change corresponding to the variable impedance of the selected memory cell.

In another disclosed embodiment, a memory device includes a plurality of memory cells in an array, and a read circuit. The read circuit is configured to effect a voltage transition of a signal node at a variable rate corresponding to a data value stored within a selected memory cell, and to perform a time-to-transition measurement of the signal node to determine the data value stored within the selected memory cell.

BRIEF DESCRIPTION OF THE DRAWINGS

For a detailed description of various embodiments, reference will now be made to the accompanying drawings in which.

It should be noted that the structures and timing diagrams depicted in the various figures are not necessarily drawn to scale, but rather are drawn in a manner to more clearly illustrate the teachings depicted therein.

DETAILED DESCRIPTION

Certain terms are used throughout the following description and claims to refer to particular system components. As one skilled in the art will appreciate, different companies may refer to a component by different names. This document does not intend to distinguish between components that differ in name but not in function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be an example of that embodiment, and not intended to intimate that the scope of the disclosure, including the claims, is limited to that embodiment.

The ability to store multiple bits in a single memory cell may be beneficial to computer users. The ability to store multiple bits in a single memory cell allows more data to be stored in the same physical space. Furthermore, the ability to perform mathematical operations using memory cells may be beneficial to machine language programmers. In order to implement both the ability to store multiple bits in a single memory cell as well as improve on an ability to perform mathematical operations using memory cells, various methods and systems are described below, directed to interpreting data stored in a memory cell.

Figure 1:
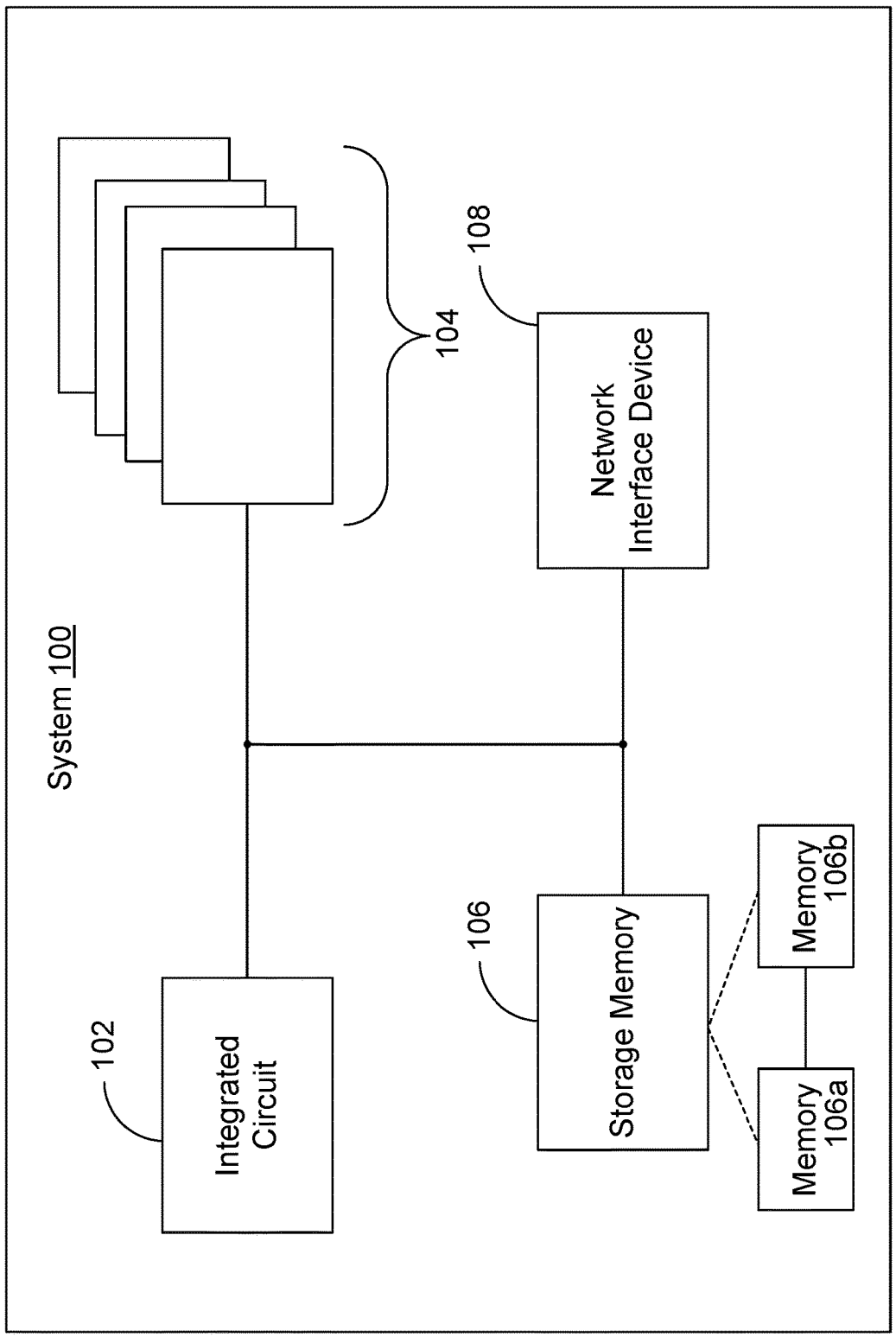
FIG. 1 shows, in block diagram form, an example computing system comprising memory structures in accordance with at least some embodiments.

FIG. 1 illustrates an environment within which memory in accordance with embodiments described herein may be used. In particular, FIG. 1 illustrates a computing system 100 that may utilize memory in accordance with embodiments described herein. The computing system 100 may be illustrative of, for example, a laptop, a desktop computer, a computer within a node of several computers, a cell phone, a tablet, or any other computing system that may utilize memory in accordance with embodiments described herein. In particular various components in the illustrative computing system 100 may use memory in accordance with embodiments described herein. The computer system 100 comprises an integrated circuit (IC) 102 and one or more memory 104 coupled to IC 102, where one or more memory 104 may comprise memory in accordance with embodiments described herein.

IC 102 represents any computing element present in a system. For example, IC 102 may be a central processing unit (CPU), a processing element, a graphics processing unit (GPU), hardware accelerator, system on a chip (SOC), digital signals processor (DSP), a machine learning unit, a matrix operations unit (MOU), etc. In some embodiments, IC 102 may comprise memory in accordance with embodiments described herein.

For example, IC 102 may comprise L3 cache memory in accordance with embodiments described herein. Additionally, memory in accordance with embodiments described herein, may be used as part of a computation process such as in the GPU, and in various chips such as the MOU tailored for machine learning. A MOU may perform matrix transpose and transformation operations. The MOU may also perform matrix arithmetic.

Additionally, IC 102 and one or more memory 104 may be coupled to storage device 106, and a network interface device 108. In some embodiments, the storage device 106 may comprise a hard drive, solid state disk, memory stick, optical disc, etc. The storage device 106 may comprise a non-transitory computer readable storage medium on which programs executable by IC 102 may be stored and accessed when needed by IC 102. Storage device 106 is not restricted to being comprised of only one type of memory. For example, in some embodiments, storage device 106 may comprise memory 106a and memory 106b used as a buffer for a solid state disk (storage device 106). Memory 106a may be a buffer for memory 106b which is a buffer for storage device 106.

Programs stored on the storage device 106 may comprise programs to implement various processes on the computer system 100. In some cases, the programs are copied from the storage device 106 to the memory 104, and the programs are executed from the memory 104. Thus, both the memory 104 and storage device 106 shall be considered computer-readable storage mediums.

In various embodiments, network interface device 108 may allow computer system 100 to exchange data over a wireless or wired network. In some embodiments, the computer system 100 may be connected to a plurality of other computers within a shared network.

Additionally, although a computing system 100 has been described to illustrate an environment in which memory in accordance with embodiments described herein may be present, embodiments of memory discussed herein are not limited to this specific environment. For example, memory in accordance with embodiments discussed herein may be used in vehicles, internet appliances, wireless local area network (LAN) hardware, switches, network interface devices, audio players, flash storage cards, televisions, cameras, video recorders, etc.

Figure 2:
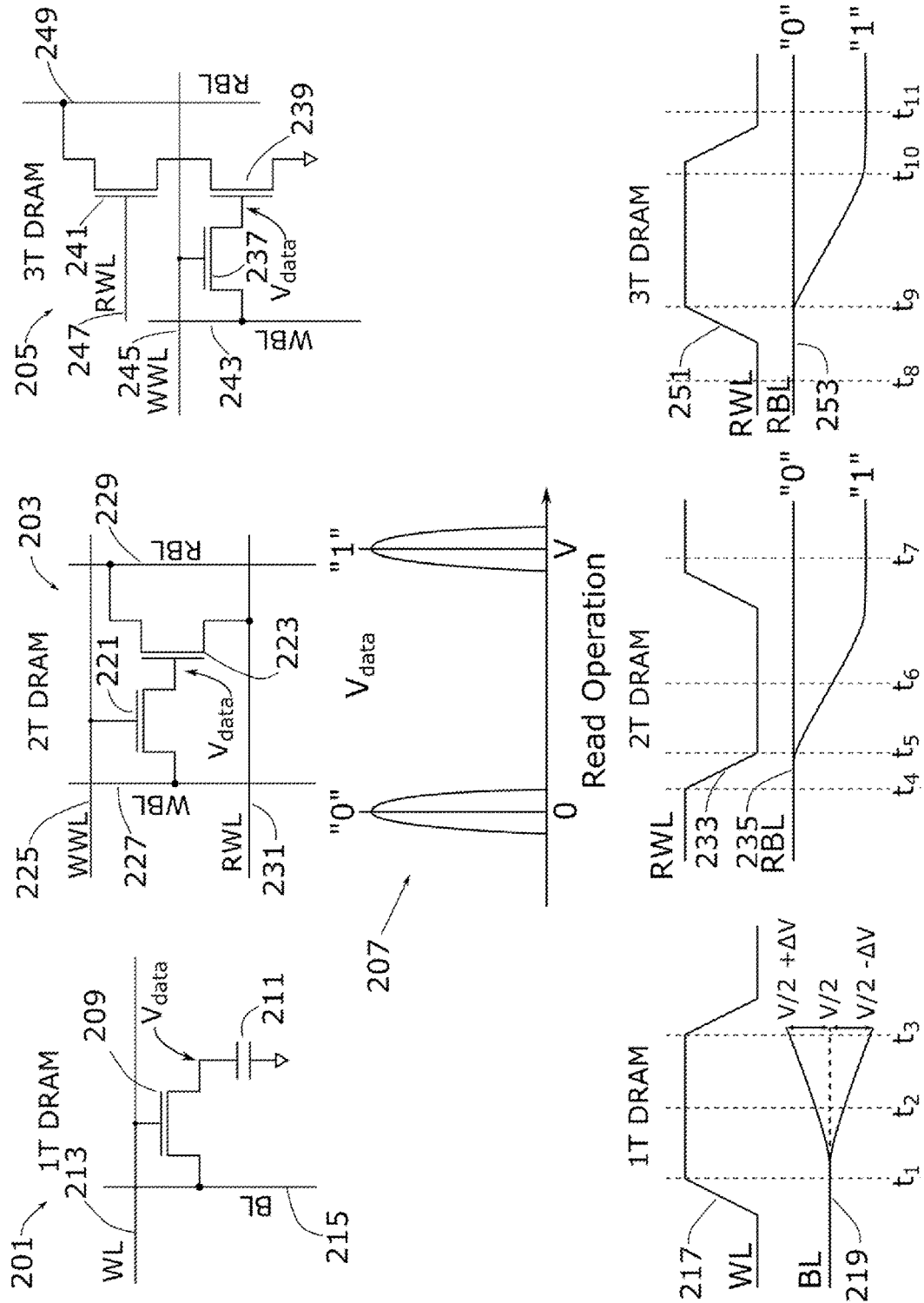
FIG. 2 shows, in partial block diagram form, DRAM memory cells and characteristics associated with each type of DRAM memory cell.

Turning now to FIG. 2, features of various memory in accordance with various embodiments of memory described herein are discussed. Where the memory described herein may be used, for example, in IC 102, memory 104 or storage device 106 are discussed. In particular, block diagrams 201, 203, and 205 illustrate a one transistor (1T) DRAM cell, a two transistor (2T) DRAM cell, and a three transistor (3T) DRAM cell, respectively. In each memory cell, a value $V_{data}$ is stored in a storage node either as a logical 0 ("0") or a logical 1 ("1"). Values for $V_{data}$ are shown in graph 207.

The 1T DRAM memory cell 201, comprises a transistor 209 connected in series with a capacitor 211. A gate terminal of the transistor 209 is connected to a word line (WL) 213, while a source or drain terminal of the transistor 209 is connected to the bit line (BL) 215.

The 1T DRAM memory cell 201 stores data $V_{data}$ at a storage node between the transistor 209 and capacitor 211. During operation, BL 215 is charged to a level V/2 and during a read operation, the voltage of the BL 215 will change by delta V (i.e., ΔV). That is, during a read operation, the voltage of BL 215 will either increase or decrease relative to V/2 by an amount ΔV, indicating the logical value stored in the memory cell. Characteristics of WL 213, and the BL 215 of the 1T DRAM memory cell 201 during a read operation are illustrated by line graphs 217 and 219.

In particular, line graph 217 illustrates voltage values of the WL 213 during a read operation, and line graph 219 illustrates voltage values of the BL 219 during the same read operation. At time $t_1$, the voltage level of the word line 213 increases. After a time delay, at a subsequent time $t_2$, the voltage level of the BL 219 begins to either increase or decrease, depending on the logical value stored in the memory cell. At time $t_3$, the voltage value of BL 315 reaches a threshold voltage value sufficient to be processed and interpreted as a logical "0" or "1".

A 2T DRAM memory cell 203 comprises two transistors 221 and 223 where a drain terminal of transistor 221 is connected to the gate terminal of the transistor 223. $V_{data}$ is also stored at a storage node comprising a connection between transistor 221 and transistor 223. A write word line 225 is connected to the gate terminal of transistor 221, while a write bit line 227 is connected to the source terminal of transistor 221. The source and drain terminals of transistor 223 are connected to read bit line 229 and read word line 231.

Of note, the source and drain terminals in any NMOS transistor discussed herein are interchangeable. Accordingly, if one example describes a configuration identifying a source and drain terminal, embodiments in which the source and drain terminal designations are switched are also contemplated. Furthermore, embodiments described herein are in accordance with implementations using NMOS transistors. Implementations using PMOS transistors are also contemplated and descriptions complementary to those provided herein as also contemplated.

Depicted in line graph 233, the voltage levels on read word line 231 during a read operation are shown and corresponding voltage level on read bit line 229 are shown in line graph 235. Initially, at time $t_4$, the voltage levels of the read word line 231 and read bit line 229 are "high", or some value above 0V.

In relation to voltages present at the terminals of a transistor, a "high" value may correspond to a logical "1" value. A "high" value may correspond to a "VDD" voltage value. A "low" value as referenced herein, may correspond to a voltage value that introduces a potential difference between a "high" value sufficient to keep a transistor off. The "high" value may be present at a drain terminal, while the "low" value is present at the source terminal of a transistor. In one example, the "low" value may be any voltage value that is lower than the "high" value by a threshold voltage amount, where the threshold voltage defines the minimum potential difference (voltage) needed between two terminals to keep a transistor off. Thus, a "low" value is not necessarily zero, although it may be zero in some embodiments.

Continuing the discussion of line graph 233, subsequent to time $t_4$, during a read operation, the read word line voltage level is dropped below the initial "high" value. At time $t_5$, the read word line voltage level reaches a "low" level. After a time delay and subsequent to time $t_5$, the read bit line voltage level may remain unchanged (stay "high") or begin changing to a "low" level (time $t_6$) depending on the value of $V_{data}$. Whether or not the read bit line voltage level stays the same or shifts indicates the value of $V_{data}$ stored in the memory cell. At time $t_7$, the read word line voltage level is returned to the initial "high" level.

A 3T DRAM memory cell 205 comprises three transistors 237, 239, and 241. Two transistors 239 and 241 are connected in series while a drain terminal of transistor 237 is connected to a gate terminal of transistor 239. $V_{data}$ is stored at the node where the drain terminal of transistor 237 is connected to the gate terminal of transistor 239. A source terminal of transistor 237 is connected to a write bit line 243, while a write word line 245 is connected to a gate terminal of transistor 237. A read word line 247 is connected to a gate terminal of transistor 241, while a drain terminal of transistor 241 is connected to a read bit line 249.

Depicted in line graph 251, the voltage levels on read word line 247 during a read operation are shown and corresponding voltage levels on read bit line 253 are shown in line graph 253. Initially at time $t_8$, the read word line voltage level starts out "low" while the read bit line voltage level starts out "high." During a read operation at time $t_9$, the voltage level on read word line 251 is increased. Subsequently after a time delay, at time $t_{10}$, depending on the value stored as $V_{data}$, the voltage level of read bit line 249 will remain unchanged or drop. At time $t_{11}$, the voltage level on the read word line 247 is returned to a "low" level.

As illustrated in line graphs 219, 235, and 253, changes in voltages on the read bit lines are gradual and occur after a time delay. The rate of change of the voltage may vary based on characteristics of a transistor and an amount of voltage on the gate terminal. Additionally, the amount of voltage on the gate terminal also correlates to the amount of current that will flow through the transistor.

Figure 3:
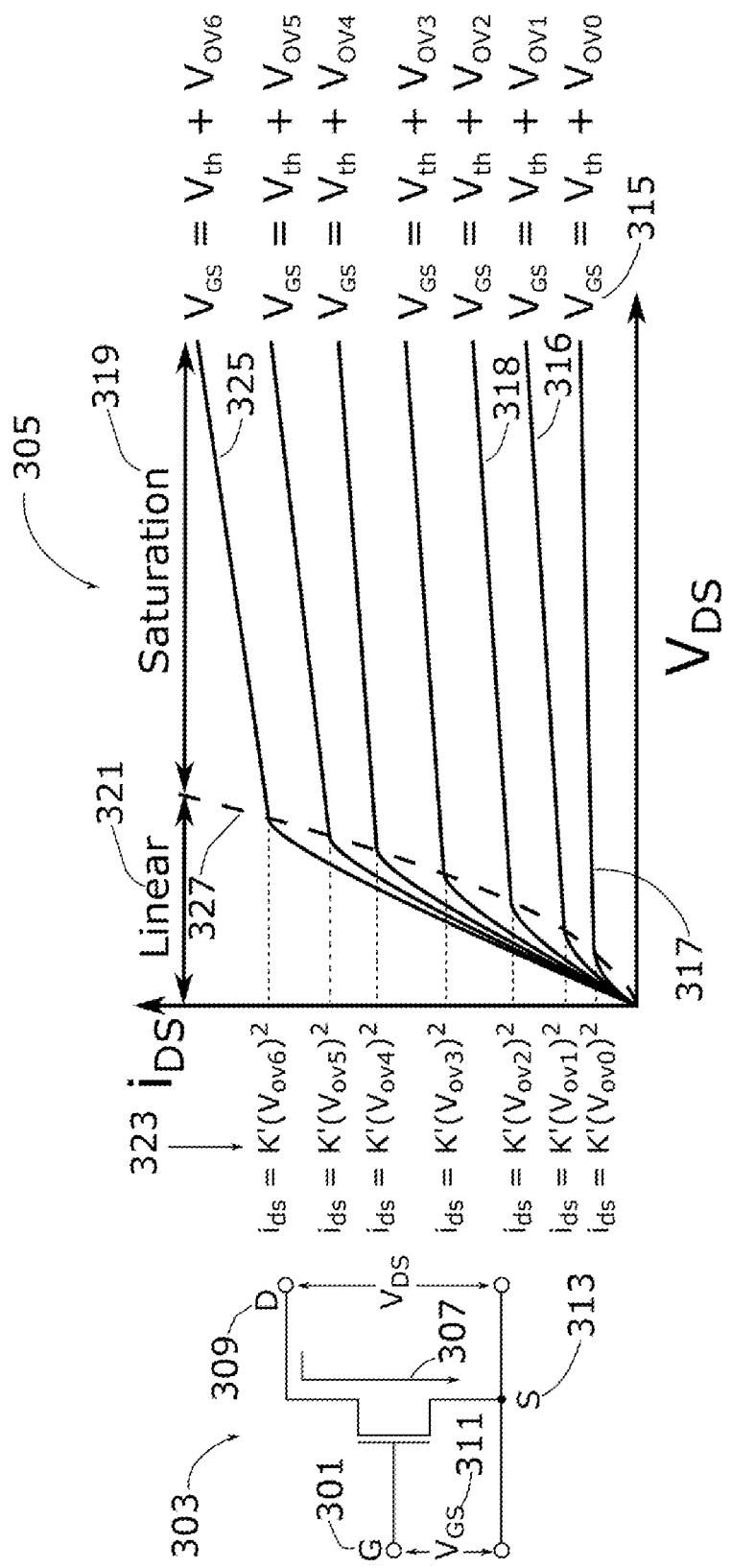
FIG. 3 shows an example graph depicting a relationship between current and voltage in a transistor.

Turning now to FIG. 3, current voltage characteristics of a transistor as well as a block diagram of a transistor are described. Current flow shown in transistor 303 is shown using conventional flow notation, as opposed to electron flow notation. In particular, the amount of voltage applied at a gate terminal 301 of transistor 303 may determine the amount of current 305 flowing through the transistor. The following characteristics as discussed in graph 305 of transistor 303 may be used to store multiple values in a single memory cell as described herein.

In the various configurations of a DRAM memory cell, discussed in FIG. 2, a read bit line (e.g., 215, 229, 249) is connected to a drain or source terminal of a transistor. Transistor 303 may represent any of the transistors 209, 223, and 241, where a read bit line is connected to a drain terminal 309. When a sufficient gate voltage 311 is applied to gate terminal 301, to turn on transistor 303, current 307 begins to flow from the drain terminal 309 to the source terminal 313.

As mentioned previously, the source and drain terminals of a typical negative-channel metal-oxide (NMOS) transistor, such as transistor 303, are interchangeable. The source and drain terminals may be referred to as conduction electrodes. Given a sufficient voltage such as a voltage amount greater than a threshold voltage amount is applied at gate terminal 301, current will flow between the conduction electrodes based on whether one conduction electrode is at a lower potential in relation to the other conduction electrode. In an example scenario where sufficient voltage is applied to gate terminal 301, if no potential difference is present between the conduction electrodes, current will not flow between the conduction electrodes.

In application, a source or drain designation assigned to a respective conduction electrode may reflect a given state of the transistor and the direction of current flow between two conduction electrodes. In some scenarios, the drain terminal is at a higher potential than the source terminal. However, the source and drain designations assigned within this document are not meant to imply a direction of current flow for a given example described herein. To ease discussion, in the examples discussed herein, one conduction electrode of a transistor has been labeled a drain terminal and the other terminal labeled a source terminal. For a given example where respective conduction electrodes have been designated as source and drain, embodiments where the source and drain designations are switched from what is described herein, are contemplated as well.

Continuing the discussion of transistor 303, as a read bit line (e.g., 215, 229, or 249) is connected to a drain or source terminal, the current flowing between the drain and source terminals of a transistor (e.g., transistor 209, 223, 239, 241) may correspond to a bit line discharging. The amount of voltage 311 applied at a gate terminal of a transistor with respect to a source terminal or the amount of voltage 311 applied at a source terminal of a transistor with respect to a gate terminal may also determine the amount of time taken and the rate of discharge, of a bit line for example. For example, in a 1T or 3T DRAM cell, a voltage is applied at a gate terminal with respect to a source terminal. In a 2T DRAM cell, voltage is applied at a source terminal with respect to a gate terminal. Accordingly, based on a measured time delay for a bit line to discharge, the multiple values may be measured and detected.

In graph 305, the x-axis represents voltage values across the source and drain terminals (313 and 309, respectively) of transistor 303, while the y-axis represents an amount of current 307 flowing between the source and drain terminals (313 and 309). In graph 305, the different $V_{GS}$ curves (e.g., 317, 316, 318, and 325), represent different voltage amounts $V_{GS}$ applied at gate terminal 301 and corresponding current ($i_{DS}$) and voltage ($V_{DS}$) characteristics for each $V_{GS}$.

As shown by the different $V_{GS}$ curves, different voltage amounts applied to gate terminal 301 may determine an amount of current flowing through transistor 303 and an amount of voltage measured across the source and drain terminals (313 and 309). For example $V_{GS}$ curve 317 depicts the amount of current that may flow through transistor 303, for a particular $V_{GS}$ level 315 and as the voltage across the source and drain terminals is increased ($V_{DS}$).

Each $V_{GS}$ voltage level is set above the threshold voltage ($V_{th}$) by an amount defined as the overdrive voltage (e.g., $V_{OV1}$), where $V_{OV6}$ represents an amount greater than $V_{OV0}$. Accordingly, the $V_{GS}$ level equaling the threshold voltage plus $V_{OV6}$ is greater than the $V_{GS}$ level equaling the threshold voltage plus $V_{OV0}$. For a given $V_{GS}$ level, the amount of current flowing through the transistor 303 increases as $V_{DS}$ is increased initially (linear region of operation 321).

After some value of $V_{DS}$ is reached, for each $V_{GS}$ curve, additional increases in $V_{DS}$ do not substantially impact the current ($i_{DS}$) flowing through transistor 303 and the transistor is considered to be operating in a saturation region of operation 319. Changes in $V_{DS}$ have more influence on the current flowing through transistor 303 in the linear region of operation 321. For each $V_{GS}$ curve, the transition between modes of operation from the linear region of operation 321 to the saturation region of operation 319 is marked by dashed line 327.

As shown in graph 305, $i_{DS}$ is a function of the overdrive voltage ($V_{OV}$), which is the amount by which the gate-to-source voltage ($V_{GS}$) exceeds the threshold voltage ($V_{th}$). In particular, as shown in column 323, taking curve 317 as an example:

$$i_{DS} = K'(V_{OV0})^2 \tag{1}$$

where K' is a parameter further representing technology and device parameter constants of the transistor, more specifically:

$$K' = \mu_n C_{ox}(W/L) \tag{2}$$

where $\mu_n$ represents surface mobility, $C_{ox}$ represents gate oxide capacitance per unit area, W is a width of the transistor, and L represents a length of the transistor.

Based on the $V_{GS}$ value applied at the gate terminal 311, transistor 303 may behave differently and according to the various $V_{GS}$ curves (i.e., curves 316, 317, 318, and 325) shown in graph 305. Thus, transistor 303 may operate as a variable resistor, where the amount and rate of change of $i_{DS}$ (in the linear region of operation 321) is different for each curve. In particular, during a given read operation, where a read bit line is connected to a source or drain of transistor 303, the value of the gate voltage ($V_{GS}$) dictates the $i_{DS}$ vs. $V_{DS}$ curve that is representative of the amount of $i_{DS}$ flowing through transistor 303. The value of the gate voltage ($V_{GS}$) may determine the rate at which a read line may discharge. In various embodiments, a measure of the time taken to discharge a read bit line may be used to determine a particular voltage or value that is stored in a memory cell.

Figure 4A:
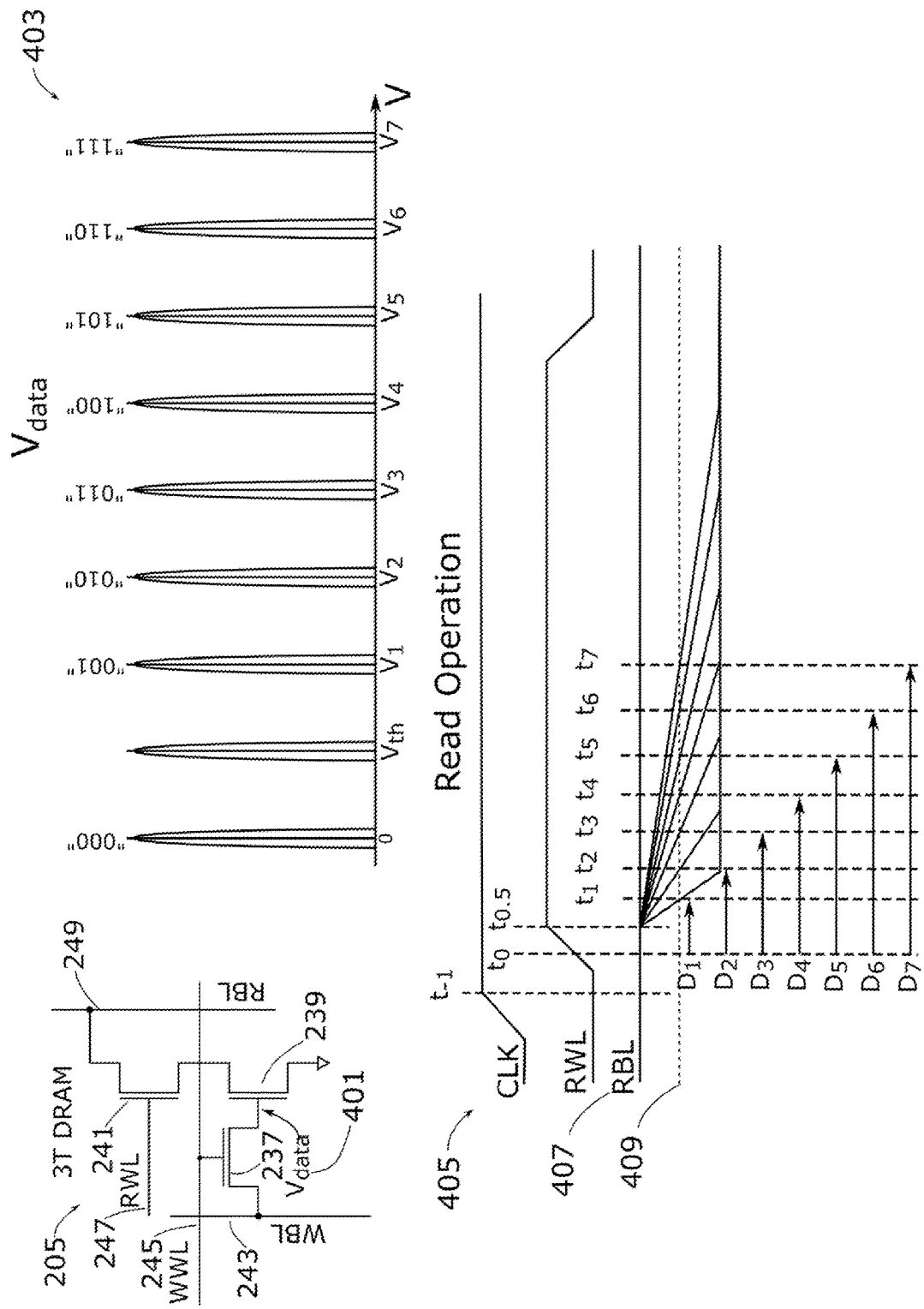
FIG. 4a shows a DRAM memory cell and a corresponding read operation in accordance with at least some embodiments.

Turning now to FIG. 4a, a memory cell and a read operation of the memory cell in accordance with various embodiments is discussed. The memory cell stores a data value Vdata, and the value of Vdata is determined by assessing the amount of time taken by the bit line to discharge to a predetermined threshold. As described in relation to FIG. 4a, the rate at which the bit line discharges is correlated to the value of Vdata. In one example, the rate at which the bit line discharges can be measured by measuring the time taken for the bit line to reach a predetermined threshold. Taking a three transistor (3T) DRAM cell (205) as an example, a method for storing and reading out multiple values in the memory cell is described.

In this example, eight logical values 0-7 for $V_{data}$, represented in binary nomenclature in graph 403 may be programmed into the 3T DRAM cell 205. In graph 403, a voltage value is represented along the x-axis. Each logical value is stored as a different voltage value.

For example, the logical value "0" may be stored as a voltage value around zero volts, the logical value "1" may be stored approximately as a voltage value "$V_1$". The logical value "2" may be stored approximately as voltage value "$V_2$" where the value of "$V_2$" is higher than "$V_1$", and the remaining logical values may be programmed accordingly where successive logical values are programmed as increasingly larger voltage values.

During operation of the 3T DRAM cell 205, the voltage value representing each logical value may not be exactly zero or "$V_1$", "$V_2$", etc. Instead, the voltage value may be within some voltage value above or below the targeted voltage values of zero, "$V_1$", "$V_2$", for example. Accordingly, voltage values that may register as a particular logical value are represented as an individual bell curve in graph 403. Each bell curve captures a potential distribution of voltage values that may correspond to a respective logical value.

The manner in which the voltage values are assigned to represent different logical values is not limited to this example and other assigning schemes may be used. That is, the assignment scheme between a voltage value and a corresponding logical value is discussed for the purpose of illustrating an embodiment and is not meant to be limiting of the type of assigning scheme that may be used. For example, the logical value "0" may be stored as a voltage value "0" while the logical value "7" is stored as a voltage value "$V_7$". Graph 403 captures one example way in which different voltage values may be used to represent different logical values. Additionally, any assigning scheme discussed in the document is considered an example and shall not constitute a limiting example.

During a read operation of the 3T DRAM cell 205, at time $t_{-1}$, a clock may go high, as represented in line graph 405. Time $t_0$, occurs subsequent to time $t_{-1}$, and time $t_0$, may represent an initial value of a measured time period (e.g., delay). Next at time $t_{0.5}$, the read word line (e.g., RWL 247) goes high. In response to the read word line (e.g., RWL 247) going high, an amount of $i_{DS}$ may begin flowing through transistor 239. The flow of $i_{DS}$ through transistor 239 also correlates to a discharge of the voltage of the bit line (e.g., RBL 249). In various embodiments, the amount of $i_{DS}$ flowing through transistor 239 and in turn, the rate of discharge of the bit line (e.g., RBL 249) depends on the voltage value of $V_{data}$ 401.

The manner and rate at which the bit line (e.g., RBL 249) discharges depends on the voltage value of $V_{data}$ 401, where $V_{data}$ 401 is stored at a storage node. Recall the different $V_{GS}$ curves shown in graph 305 for different values of $V_{GS}$. The higher voltage value of $V_{GS}$ (curve 325) would correspond to a faster discharge rate of the bit line than a lower voltage value of $V_{GS}$, such as curve 317. That is, if a voltage value of "$V_7$" is stored as $V_{data}$, (in this example "$V_7$" may follow the curve represented by curve 325 in graph 305), the discharge may occur sooner than the other $V_{GS}$ curves in graph 305.

In detecting a bit line discharge, the bit line is considered sufficiently discharged after it has reached a predetermined threshold (e.g., predetermined threshold 409). Various circuitry may be used to assess the voltage level of the bit line and make a determination as to whether the bit line has sufficiently discharged. For example, a voltage comparator may be utilized to compare the bit line to a reference voltage, such as a reference voltage provided by a bandgap reference circuit, or other reference voltage. In another example, a "skewed" inverter having a higher than usual trip point may be utilized. Such a skewed inverter may be implemented by sizing the PMOS transistor to be stronger than the NMOS transistor.

In some embodiments, a strobe clock may be programmed to fire during a predefined time window, where an indicator is captured during the predefined time window. The indicator may be produced by the various circuitry used to assess the voltage level of the bit line. In some embodiments, the various circuitry may comprise a comparator, circuitry capable of capturing a voltage level of the bit line, etc. Thus the indicator may comprise various forms. For example, the indicator may be a value output by the comparator, or the value may reflect the voltage value of the bit line. Overall, the indicator contains data that may be used to determine whether a voltage level of the bit line has fallen below a predetermined threshold amount.

In the embodiment illustrated in FIG. 4*a*, a read is performed by correlating a length of a delay (e.g., $D_1$, $D_2$, $D_3$ ..., $D_7$) to a data value. During a read operation, any of the lengths of delays may occur. Based on the particular length of delay that is measured, the data value $V_{data}$ is determined. In various embodiments, the length of each delay is measured from the initial value $t_0$.

In the example of FIG. 4*a* and the graph 405, the delay $D_1$ has a length (e.g., time period) spanning $t_0$ and $t_1$. The delay $D_2$ has a length (e.g., time period) spanning $t_0$ and $t_2$. The delay $D_3$ has a length (e.g., time period) spanning $t_0$ and $t_3$. The delay $D_4$ has a length (e.g., time period) spanning $t_0$ and $t_4$. The delay $D_5$ has a length (e.g., time period) spanning $t_0$ and $t_5$. The delay $D_6$ has a length (e.g., time period) spanning $t_0$ and $t_6$. The delay $D_7$ has a length (e.g., time period) spanning $t_0$ and $t_7$.

In graph 405, each of the times $t_1$, $t_2$, $t_3$, $t_4$, $t_5$, $t_6$, and $t_7$ represents a time at which the bit line has discharged to around the predetermined threshold. Of note, during a read operation, the bit line will either discharge or fail to discharge (e.g., maintain charge). In the event the bit line discharges, the bit line will discharge to around the predetermined threshold at one of the times $t_1$, $t_2$, $t_3$, $t_4$, $t_5$, $t_6$, or $t_7$. That is, the several different times are examples of various times around which the bit line may reach the predetermined threshold. In graph 405, the value (e.g., voltage level) of the bit line is represented by RBL 407.

Of note, throughout this disclosure, references to a read word line "RWL" and a word line are interchangeable. References to a read word line or word line herein, imply a control signal configured to enable a read operation of a memory cell. Accordingly, any terms or mechanisms that implement the functions of a control signal that enable a read operation of a memory cell are implicated through the terms read word line or word line. Similarly, a read bit line and a bit line are interchangeable. References herein to reading a read bit line or a bit line imply reading the output of a memory cell during a read operation. Accordingly, any terms or mechanisms used to read the output of a memory cell are implicated with regards to reading a read bit line or bit line.

To illustrate a read operation by way of example, if $V_{data}$ stores a voltage value "$V_7$", the bit line may discharge to the predetermined threshold 409 around time $t_1$. Accordingly, the delay $D_1$ captures the time period within which the bit line discharges to around the predetermined threshold. The delay $D_1$ represents the shortest time period having a length spanning from $t_0$ to $t_1$. In this example of a read operation, various circuitry correlates the delay $D_1$ to $V_{data}$ storing the voltage value of "$V_7$".

In another example of a read operation, $V_{data}$ stores a different value of "$V_6$", where "$V_6$" has a lower voltage level than the voltage value of "$V_7$". Due to "$V_6$" having a lower voltage level, the bit line may take longer to discharge than if $V_{data}$ stored the value "$V_7$". Accordingly, the bit line may discharge around time $t_2$ subsequent to time $t_0$ and indicated by delay $D_2$. The delay $D_2$ has a length spanning from $t_0$ to $t_2$. In this example of a read operation, various circuitry correlates the delay $D_2$ to $V_{data}$ storing the voltage value of "$V_6$".

Overall, the lower the voltage level of a stored $V_{data}$, the longer it may take a bit line to discharge. Accordingly, in the example provided in FIG. 4*a*, $V_{data}$ 401 with a voltage level of "$V_7$" will experience a bit line that is sufficiently discharged, or a bit line that has reached a predetermined threshold, around time $t_1$. $V_{data}$ 401 with a voltage level of "$V_6$" will experience a bit line that is sufficiently discharged, or a bit line that has reached a predetermined threshold, around time $t_2$. $V_{data}$ 401 with a voltage level of "$V_5$" will experience a bit line that is sufficiently discharged, or a bit line that has reached a predetermined threshold around time $t_3$. $V_{data}$ 401 with a voltage level of "$V_4$" will experience a bit line that is sufficiently discharged, or a bit line that has reached a predetermined threshold around time $t_4$, so on and so forth. For the case where $V_{data}$ 401 is equal to zero volts, the read bit line will continue to stay high. Accordingly, a read bit line that continues to stay high for a set time quantity may indicate that $V_{data}$ 401 is equal to zero volts.

In various embodiments, in order to detect the span of time taken by the bit line to sufficiently discharge, or reach a predetermined threshold, a strobe clock or a plurality of strobe clocks may be coupled to the bit line. Each of the plurality of strobe clocks is set to fire at different time windows and cause surrounding circuitry to strobe the bit line or a comparator connected to the bit line to determine whether sufficient discharge has occurred. Upon detecting that a bit line voltage has fallen below the predetermined voltage level, the corresponding strobe clock may dictate the time window within which an indicator is captured. Based on the specific strobe clock that captures an indicator reflecting that the bit line has fallen below a predetermined threshold, surrounding circuitry may determine the span of time the bit line has taken to discharge to the predetermined threshold voltage as indicated by the time spans (e.g., delays) $D_1$, $D_2$, $D_3$, $D_4$, $D_5$, $D_6$, and $D_7$.

Whether or not sufficient discharge has occurred may be determined by any known method in art. For example, a determination may be made that sufficient discharge has occurred by checking a state of a comparator connected to read bit line 249. The voltage level of the read bit line 249 may be compared to a predetermined threshold (e.g. $V_{REF}$) to assess whether read bit line 249 has discharged a sufficient amount.

Based on a length of time taken for a bit line to discharge sufficiently, surrounding circuitry may determine the voltage value of $V_{data}$ stored in the memory cell, which in turn is correlated to a logical value. In the situation where $V_{data}$ is equal to zero volts, the surrounding circuitry may determine $V_{data}$ is zero volts after detecting the bit line remains high for a time quantity that is greater than a predetermined threshold amount of time. The concept of correlating a time window for discharge to a voltage value and in turn a logical value may be applied to other types of memory cells such as a 2T or 1T DRAM cell or any other non-volatile memory cells.

Figure 4B:
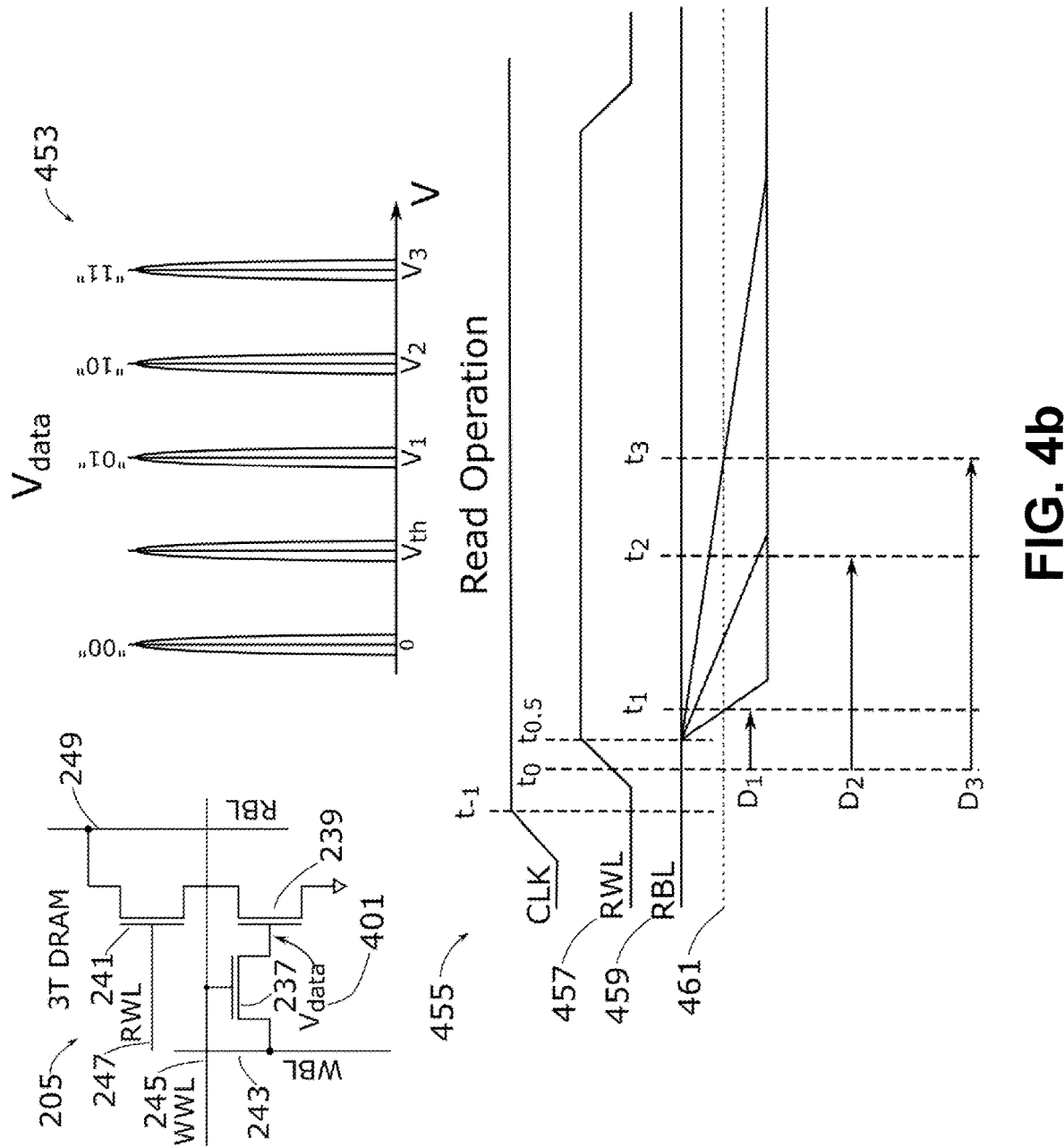
FIG. 4b shows a DRAM memory cell and a corresponding read operation in accordance with at least some embodiments.

Turning now to FIG. 4b, a memory cell and a read operation of the memory cell in accordance with various embodiments is discussed. The memory cell stores a data value Vdata, and the value of Vdata is determined by assessing the amount of time taken by the bit line to discharge to a predetermined threshold. Similar to FIG. 4a, in FIG. 4b, the rate at which the bit line discharges is correlated to the value of Vdata. The rate at which the bit line discharges can be measured by measuring the time taken for the bit line to reach a predetermined threshold.

In this example in FIG. 4b, a three transistor (3T) DRAM 205, stores four logical values 0-3. Graph 453 is representative of the four logical values represented in binary nomenclature and possible respective voltage distributions for each of the four states. In graph 453, a voltage value is represented along the x-axis. Each logical value is stored as a different voltage value.

For example, the logical value "0" may be stored as a voltage value around zero volts, the logical value "1" may be stored approximately as a voltage value "$V_1$". The logical value "2" may be stored approximately as voltage value "$V_2$" where the value of "$V_2$" is higher than "$V_1$", and the remaining logical values may be programmed accordingly where successive logical values are programmed as increasingly larger voltage values.

During operation of the 3T DRAM cell 205 in FIG. 4b, the voltage value representing each logical value may not be exactly zero or "$V_1$", "$V_2$", etc. Instead, the voltage value may be within some voltage value above or below the targeted voltage values of zero, "$V_1$", "$V_2$", for example. Accordingly, voltage values that may register as a particular logical value are represented as an individual bell curve in graph 453. Each bell curve captures a potential distribution of voltage values that may correspond to a respective logical value.

The manner in which the voltage values are assigned to represent different logical values is not limited to this example and other assigning schemes may be used. That is, the assignment scheme between a voltage value and a corresponding logical value is discussed for the purpose of illustrating an embodiment and is not meant to be limiting of the type of assigning scheme that may be used. For example, the logical value "0" may be stored as a voltage value "0" while the logical value "3" is stored as a voltage value "$V_3$". Graph 453 captures one example way in which different voltage values may be used to represent different logical values. Additionally, any assigning scheme discussed in the document is considered an example and shall not constitute a limiting example.

During a read operation of the 3T DRAM cell 205 in FIG. 4b, at time $t_{-1}$, a clock may go high, as represented in line graph 455. Time $t_0$, occurs subsequent to time $t_{-1}$, and time $t_0$, may represent an initial value of a measured time period (e.g., delay). Next at time $t_{0.5}$, the read word line (RWL) goes high. In graph 455, RWL 457 is representative of values coupled to RWL 247 in the memory cell 250. In response to the read word line (e.g., RWL 247) going high, an amount of $i_{DS}$ may begin flowing through transistor 239. The flow of $i_{DS}$ through transistor 239 also correlates to a discharge of the voltage of the bit line (e.g., RBL 249). In various embodiments, the amount of $i_{DS}$ flowing through transistor 239 and in turn, the rate of discharge of the bit line (e.g., RBL 249) depends on the voltage value of $V_{data}$ 401.

The manner and rate at which the bit line (e.g., RBL 249) discharges depends on the voltage value of $V_{data}$ 401, where $V_{data}$ 401 is stored at a storage node. Recall the different $V_{GS}$ curves shown in graph 305 for different values of $V_{GS}$. The higher voltage value of $V_{GS}$ (curve 325) would correspond to a faster discharge rate of the bit line than a lower voltage value of $V_{GS}$, such as curve 317. That is, if a voltage value of "$V_3$" is stored as $V_{data}$, (in this example "$V_3$" may follow the curve represented by curve 325 in graph 305), the discharge may occur at time $t_0$. As "$V_3$" may follow the curve 325 (graph 305), the discharge may occur sooner than the other $V_{GS}$ curves in graph 305.

In detecting a bit line discharge, the bit line is considered sufficiently discharged after it has reached a predetermined threshold (e.g., predetermined threshold 461). Various circuitry may be used to assess the voltage level of the bit line and make a determination as to whether the bit line has sufficiently discharged. For example, a voltage comparator may be utilized to compare the bit line to a reference voltage, such as a reference voltage provided by a bandgap reference circuit, or other reference voltage. In another example, a "skewed" inverter having a higher than usual trip point may be utilized. Such a skewed inverter may be implemented by sizing the PMOS transistor to be stronger than the NMOS transistor.

In some embodiments, a strobe clock may be programmed to fire during a predefined time window, where an indicator is captured during the predefined time window. The indicator may be produced by the various circuitry used to assess the voltage level of the bit line. In some embodiments, the various circuitry may comprise a comparator, circuitry capable of capturing a voltage level of the bit line, etc. Thus the indicator may comprise various forms. For example, the indicator may be a value output by the comparator, or the value may reflect the voltage value of the bit line. Overall, the indicator contains data that may be used to determine whether a voltage level of the bit line has fallen below a predetermined threshold amount.

In the embodiment illustrated in FIG. 4b, a read is performed by correlating a length of a delay (e.g., D1, D2, D3, etc.) to a data value. During a read operation, any of the lengths of delay may occur. Based on the particular length of delay that is measured, the data value $V_{data}$ is determined. In various embodiments, the length of each delay is measured from the initial value $t_0$.

In the graph 455 of FIG. 4b, the delay $D_1$ has a length (e.g., time period) spanning $t_0$ and $t_1$. The delay $D_2$ has a length (e.g., time period) spanning $t_0$ and $t_2$. The delay $D_3$ has a length (e.g., time period) spanning $t_0$ and $t_3$. In graph 455, each of the times $t_1$, $t_2$, and $t_3$ represents a time at which the bit line has discharged to around the predetermined threshold 461. Of note, during a read operation, the bit line will either discharge or fail to discharge (e.g., maintain charge). In the event the bit line discharges, the bit line will discharge to around the predetermined threshold 461 at one of the times $t_1$, $t_2$, or $t_3$. That is, the several different times are examples of various times around which the bit line may reach the predetermined threshold 461. In graph 455, the value (e.g., voltage level) of the bit line is represented by RBL 459.

To illustrates a read operation by way of example, if $V_{data}$ stores a voltage value "$V_3$", the bit line may discharge to the predetermined threshold 461 around time $t_1$. Accordingly, the delay $D_1$ captures the time period within which the bit line discharges to around the predetermined threshold. The delay $D_1$ represents the shortest time period having a length spanning from $t_0$ to $t_1$. In this example of a read operation, various circuitry correlates the delay $D_1$ to $V_{data}$ storing the voltage value of "$V_3$".

In another example of a read operation, $V_{data}$ stores a different value of "$V_2$", where "$V_2$" has a lower voltage level than the voltage value of "$V_3$". Due to "$V_2$" having a lower voltage level, the bit line may take longer to discharge than if $V_{data}$ stored the value "$V_3$". Accordingly, the bit line may discharge around time $t_2$ subsequent to time $t_0$ and indicated by delay $D_2$. The delay has a length spanning from $t_0$ to $t_2$. In this example of a read operation, various circuitry correlates the delay $D_2$ to $V_{data}$ storing the voltage value of "$V_2$".

Overall, the lower the voltage level of a stored $V_{data}$, the longer it may take a bit line to discharge. Accordingly, in the example provided in FIG. 4b, $V_{data}$ 401 with a voltage level of "$V_3$" will experience a bit line that is sufficiently discharged, or a bit line that has reached a predetermined threshold voltage, around time $t_1$. $V_{data}$ 401 with a voltage level of "$V_2$" will experience a bit line that is sufficiently discharged, or a bit line that has reached a predetermined threshold voltage, around time $t_2$. $V_{data}$ 401 with a voltage level of "$V_1$" will experience a bit line that is sufficiently discharged, or a bit line that has reached a predetermined threshold voltage around time $t_3$. For the case where $V_{data}$ 401 is equal to zero volts, the read bit line will continue to stay high. Accordingly, a read bit line that continues to stay high for a set time quantity may indicate that $V_{data}$ 401 is equal to zero volts.

In various embodiments, in order to detect the span of time taken by the bit line to sufficiently discharge, or reach a predetermined threshold, a strobe clock or a plurality of strobe clocks may be coupled to the bit line. Each of the plurality of strobe clocks is set to fire at different time windows and cause surrounding circuitry to strobe the bit line or a comparator connected to the bit line to determine whether sufficient discharge has occurred. Upon detecting that a bit line voltage has fallen below the predetermined voltage level, the corresponding strobe clock may dictate the time window within which an indicator is captured. Based on the specific strobe clock that captures an indicator reflecting that the bit line has fallen below a predetermined threshold, surrounding circuitry may determine the span of time the bit line has taken to discharge to the predetermined threshold voltage as indicated by the time spans (e.g., delays) $D_1$, $D_2$, and $D_3$.

Whether or not sufficient discharge has occurred may be determined by any known method in art. For example, a determination may be made that sufficient discharge has occurred by checking a state of a comparator connected to read bit line 249. The voltage level of the read bit line 249 may be compared to a predetermined threshold amount to assess whether read bit line 249 has discharged a sufficient amount.

Based on a length of time taken for a bit line to discharge sufficiently, surrounding circuitry may determine the voltage value of $V_{data}$ stored in the memory cell, which in turn is correlated to a logical value. In the situation where $V_{data}$ is equal to zero volts, the surrounding circuitry may determine $V_{data}$ is zero volts after detecting the bit line remains high for a time quantity that is greater than a predetermined threshold amount of time. The concept of correlating a time window for discharge to a voltage value and in turn a logical value may be applied to other types of memory cells such as a 2T or 1T DRAM cell or any other non-volatile memory cell.

The examples of three transistor (3T) DRAM discussed in FIGS. 4a and 4b describe methods for storing and reading multiple values in a memory cell. The example described in FIG. 4a includes a 3T DRAM configured to store logical values defined by three bits. In various embodiments, the 3T DRAM memory cell is configured to store one of eight states or eight voltage values, where each of the eight states represents a respective three bit value. In FIG. 4b describes a 3T DRAM configured to store logical values defined by two bits. In various embodiments, the 3T DRAM memory cell is configured to store one of four states or four voltage values, where each of the four states represents a respective two bit value. The concept of correlating a delay time to a logical value as described in FIGS. 4a and 4b, may also be applied to other types of memory cells.

Figure 5A:
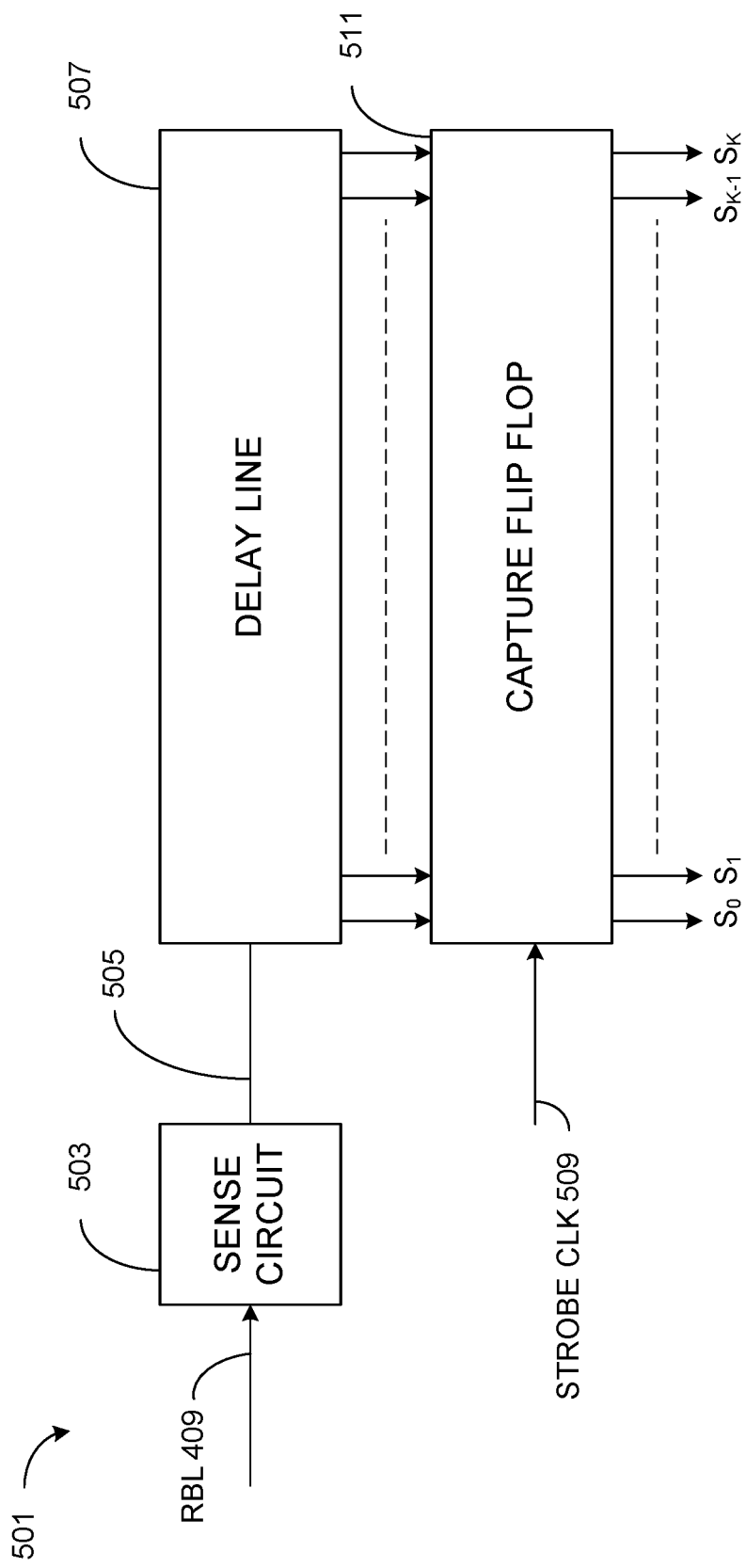
FIG. 5a shows, in block diagram form, a time-to-transition measurement circuit in accordance with at least some embodiments.

Turning now to FIG. 5a, a time-to-delay measurement circuit 501 is described. Any of the read operations discussed herein may use the time-to-delay measurement circuit to perform a read of a memory cell. In various embodiments, the example read operations discussed in FIGS. 4a and 4b, may use the circuit 501 to perform a time-to-transition method that correlates a measured delay time to a voltage value.

Block diagram 501, illustrates in block diagram form some circuitry that may correlate a measured delay time to a voltage value. Block diagram 501 comprises a sense circuit 503, a delay line 507, and a capture flip flop 511. The sense circuit 503 comprises an input coupled to a read bit line RBL 409 and an output. In various embodiments, RBL 409 is representative of RBL 249 as described in FIGS. 4a and 4b. An input of the delay line 507 couples the output of the sense circuit 505 by way of coupling 505. The delay line 507 in turn is connected to a capture flip flop 511. Accordingly, the sense circuit 503 couples the delay line 507 to RBL 409.

The capture flip flop 511 defines an input that selectively couples a strobe clock signal and an output that defines or comprises several bits (e.g., $S_0$, $S_1$, $S_2$, . . . , $S_{k-1}$, $S_k$). Furthermore, one or more outputs of the delay line 507 couple the capture flip flop 511. In some embodiments, the delay line 507 may include a serial chain of non-inverting buffers, each having a respective output that is coupled to an input of an individual flip flop within the capture flip flop 511.

In various embodiments, the sense circuit 503 is configured to determine whether RBL 409 has discharged to a predetermined threshold (e.g., predetermined threshold 409 or 461 in FIGS. 4a and 4b, respectively). In some examples, the sense circuit 503 may be a voltage comparator or a skewed inverter or a Schmitt trigger element.

During an example read operation, a strobe clock signal 509 is coupled to an input of the capture flip flop 511 to determine a delay time. During the example read operation, in response to determining RBL 409 has reached a predetermined threshold (e.g., a bit line is sufficiently discharged), the sense circuit 503 couples a sense output signal to the delay line 507. In response, the sense output signal propagates through the delay line 507. In response to a strobe clock signal 509 coupling an input of the capture flip flop 511, the circuitry 501 can determine a delay time, which in turn is correlated to a voltage value stored in the memory cell.

Providing a more specific example in relation to the time-to-delay measurement circuit 501, each respective delay time $D_1, D_2, \ldots, D_7$ (FIG. 4a) and delay times $D_1, D_2$, and $D_3$ (FIG. 4b), will couple a sense output signal to the delay line at different times. The delay $D_1$ may couple a sense output signal around a time $t_1$, while a delay $D_2$ couples a sense output signal at a time $t_2$. In this example, time $t_1$ occurs before time $t_2$. Accordingly, by the time a strobe clock signal 509 couples capture flip flop 511, the delay $D_1$ will have a longer propagation time than the delay $D_2$. In this way, the time-to-delay measurement circuit 501 may measure a delay time.

Accordingly, in an example where a delay $D_1$ (e.g., a smaller delay) is coupled to delay line 507, delay $D_1$ propagates for a longer amount of time through delay line 507. In an example where a larger delay, such as delay $D_7$ (e.g., larger delay) is coupled to delay line 507, delay $D_7$ propagates for a lesser amount of time through delay line 507. Furthermore, in an example where RBL 409 does not discharge, the sense circuit does not couple sense output signal to the delay line, and in turn, there is no change in delay line 507. When the strobe clock signal 509 couples capture flip flop 511, the output of the capture flip flop 511 reflects that no change occurred in the delay line 507.

Described in another example, $D_1$ may correlate to a case where bit line RBL 409 falls below a predetermined threshold within a first predetermined time window. In the event that the bit line falls below the predetermined threshold within the first predetermined time window, the sense circuit 503 couples a sense output signal to delay line 507. In one example, the sense output signal is a signal "1" that begins propagating through delay line 507. Of note, the sense output signal is not limited the example of where a "1" is propagated. Other values may be propagated such as a "0" or any other response value to represent the presence of the sense output signal.

In the event that the bit line does not fall within the threshold voltage value within the first predetermined time window, the sense circuit 503 does not couple the sense output signal within the first predetermined time window. Taking this scenario further, $D_2$ may be set to determine if a bit line falls below a predetermined threshold within a second predetermined time window, where the second predetermined time window occurs later in time than the first predetermined time window. In the event that the bit line falls below the threshold voltage value within the second predetermined time window, the sense circuit 503 couples a sense output signal to delay line 507. The delay line 507 begin propagating a "1" through delay line 507, which was initiated during the second predetermined time window. In this example, a sense output signal initiated during the second predetermine time window will propagate a "1" for less time than the case where a sense output signal is initiated during the first predetermined time window.

In various embodiments, delay line 507 may reflect the below values for respective delay times:

$$D_1: 1111111111111111000 \tag{3}$$

$$D_2: 1111111111111100000 \tag{4}$$

$$\ldots$$

$$D_7: 1100000000000000000 \tag{5}$$

A strobe clock 509 may be set to fire at a time $t_8$, after all delay times have passed. The strobe clock may capture data reflecting how long a "1" has propagated through the delay line and this may be correlated to voltage value of $V_{data}$ and in turn a logical value.

Accordingly, the time-to-delay measurement circuit 501 may determine the voltage value stored as $V_{data}$ by measuring a delay time using the sense circuit 503, delay line 507, and capture flip flop 511 as described in FIG. 5a. The propagation length of sense output signal within the delay line 507 may be correlated to the logical value ($V_{data}$) stored in a 3T DRAM cell.

Figure 5B:
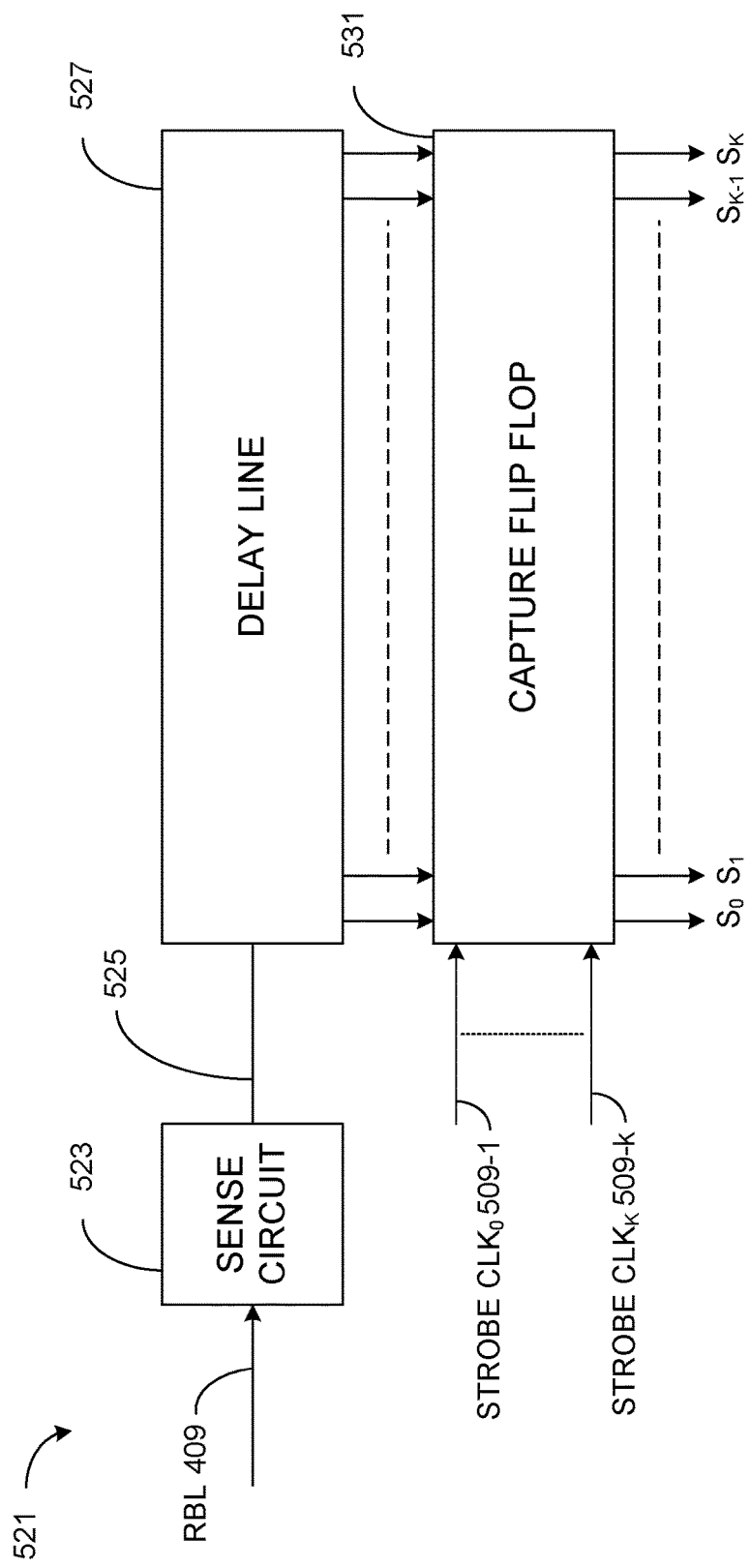
FIG. 5b shows, in block diagram form, a time-to-transition measurement circuit in accordance with at least some embodiments.

Turning now to FIG. 5b, a time-to-delay measurement circuit 521 is described. Any of the read operations discussed herein may use the time-to-delay measurement circuit to perform a read of a memory cell. In various embodiments, the example read operations discussed in FIGS. 4a and 4b, may use the circuit 521 to perform a time-to-transition method that correlates a measured delay time to a voltage value.

Block diagram 521, illustrates in block diagram form some circuitry that may correlate a measured delay time to a voltage value. Block diagram 521 comprises a sense circuit 523, a delay line 527, and a capture flip flop 531. The sense circuit 523 comprises an input coupled to a read bit line RBL 409 and an output. Similar to FIG. 5a, in various embodiments, RBL 409 is representative of RBL 249 as described in FIGS. 4a and 4b. An input of the delay line 527 couples the output of the sense circuit 523 by way of coupling 525. The delay line 527 in turn is connected to a capture flip flop 531. Accordingly, the sense circuit 523 couples the delay line 527 to RBL 409.

The capture flip flop 531 defines several inputs that selectively couple a respective strobe clock signal and an output that defines or comprises several bits (e.g., $S_0, S_1, S_2, \ldots, S_{k-1}, S_k$). Furthermore, one or more outputs of the delay line 527 couple the capture flip flop 531. In some embodiments, the delay line 527 may include a serial chain of non-inverting buffers, each having a respective output that is coupled to an input of an individual flip flop within the capture flip flop 531. The several inputs of the capture flip flop 531 may couple individual strobe clock signals 509-1, ..., 509-y.

Similar to FIG. 5a, in FIG. 5b, the sense circuit 523 is configured to determine whether RBL 409 has discharged to a predetermined threshold (e.g., predetermined threshold 409 or 461 in FIGS. 4a and 4b, respectively). In some examples, the sense circuit 523 may be a voltage comparator or a skewed inverter or a Schmitt trigger element.

In various embodiments and during an example read operation, the block 521 operates in a manner similar to that of the block 501 (FIG. 5a). For example, during a read operation, in response to determining RBL 409 has reached a predetermined threshold (e.g., a bit line is sufficiently discharged), the sense circuit 523 couples a sense output signal to the delay line 527. In response, the sense output signal propagates through the delay line 527.

In FIG. 5b, the capture flip flop 531 includes more than one input. The plurality of inputs of the capture flip flop 531 may couple one or more strobe clock signals 509-1, ..., 509-y. During the example read operation, one or more strobe clock signals 509-1, ..., 509-y may couple an input of the capture flip flop 531 to determine a delay time. Accordingly, the circuit block 521 can determine a delay time, which in turn is correlated to a voltage value stored in the memory cell.

Figure 5C:
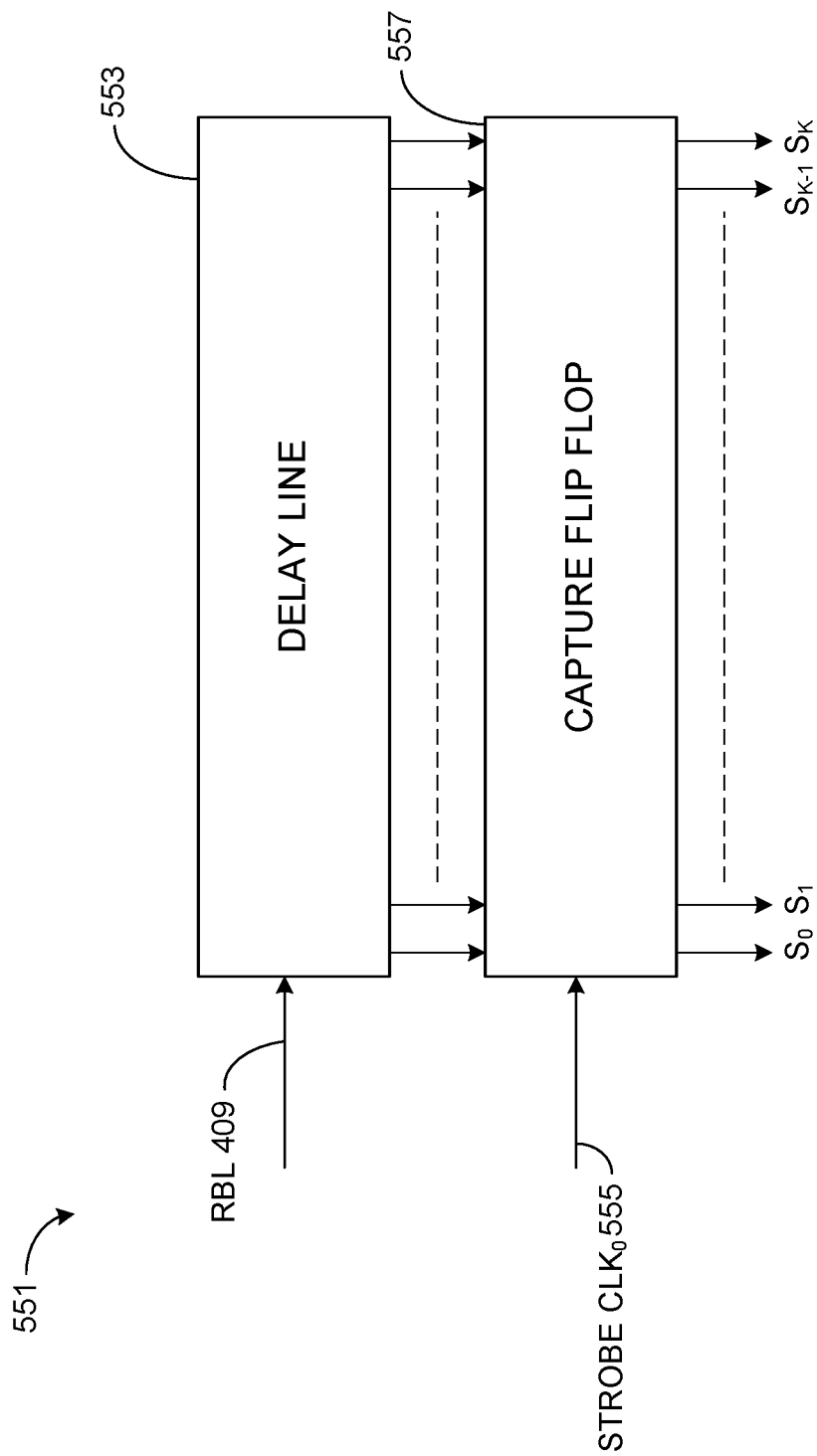
FIG. 5c shows, in block diagram form, a time-to-transition measurement circuit in accordance with at least some embodiments.

Turning now to FIG. 5c, another time-to-delay measurement circuit 551 is described. Any of the read operations discussed herein may use the time-to-delay measurement circuit to perform a read of a memory cell. In various embodiments, the example read operations discussed in FIGS. 4a and 4b, may use the circuit 551 to perform a time-to-transition method that correlates a measured delay time to a voltage value.

The block 551, illustrates in block diagram from some circuitry that may correlate a measured delay time to a voltage value. Block diagram 551 comprises a delay line 553 and a capture flip flop 557. An input of the delay line 553 couples read bit line "RBL" 409. In various embodiments, RBL 409 is representative of RBL 249 as described in FIGS. 4a and 4b. The delay line 553 in turn is connected to the capture flip flop 557.

The capture flip flop 557 defines an input that selectively couples a strobe clock signal 555 and an output that defines or comprises several bits (e.g., $S_0$, $S_1$, $S_2$, ..., $S_{k-1}$, $S_k$). Furthermore, one or more outputs of the delay line 553 couple the capture flip flop 557. In some embodiments, the delay line 553 may include a serial chain of non-inverting buffers, each having a respective output that is coupled to an input of an individual flip flop within the output capture flip flop 557. During an example read operation, the strobe clock signal 555 is provided as an input clock to the capture flip flop 557.

Figure 6:
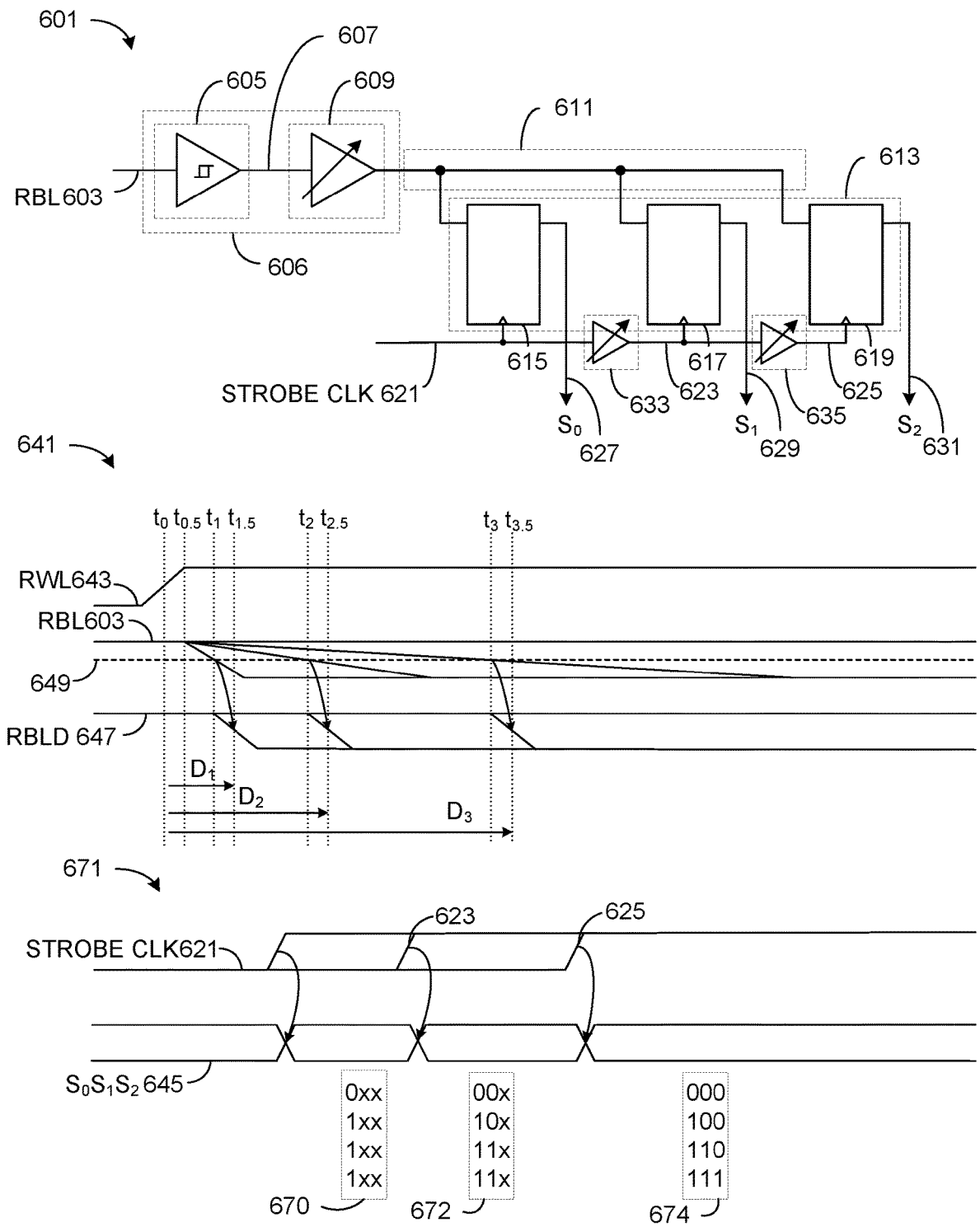
FIG. 6 shows a circuit configuration for a time-to-delay measurement circuit, in accordance with at least some embodiments.

Turning now to FIG. 6, an example circuit diagram in block diagram form (601) and respective timing and value diagrams (641 and 671) are illustrated. The block diagram 601 includes sense circuit 606, delay line 611, and capture flip flop 613. The block diagram 601 is configured to perform a time-to-transition method that correlates a measured delay time to a voltage value. In various embodiments, the block diagram 601 represents a time-to-transition or time-to-delay measurement circuit.

In some embodiments, the block diagram 601 is configured to operate in a manner similar to block 501 in FIG. 5a. In some embodiments, the block diagram 601 is a Time to Digital Converter (TDC). For purposes of this description, a time-to-transition circuit may be used interchangeably with Time to Digital Converter or time-to-delay measurement circuit.

The example block diagram 601 is configured to couple a memory cell by way of an input coupled to read bit line "RBL" 603. In various embodiments, the RBL 603 may be representative of RBL 249 as described in FIGS. 4a, 4b, and 2. In one example the block diagram 601 is coupled to a memory cell such as memory cell 205 as described in FIG. 2, where the memory cell 205 is configured to store four voltage levels representing 2 bits of data value.

The sense circuit 606 defines an input coupled to the RBL 603, a Schmitt buffer 605, an adjustable delay element 609, and an output. The delay line 611 defines an input coupled to the output of the sense circuit 606, and one or more outputs coupled to the capture flip flop 613. In one embodiment, the delay line 611 is an RC delay line that couples the output of the sense circuit 606 to the capture flip flop 613. In several embodiments, the delay line 611 is similar to the delay lines 507, 527, and 553 (FIGS. 5a, 5b, and 5c).

The capture flip flop 613 comprises a plurality of flip flops 615, 617, and 619 having respective outputs 627, 629, and 631. In the example described herein, the outputs 627, 629, and 631 respectively couple output values $S_0$, $S_1$, and $S_2$. That is, the output value $S_0$ couples the output 627, the output value $S_1$ couples the output 629, and the output value $S_2$ couples the output 631. The capture flip flop 613 further comprises adjustable delay elements 633 and 635, and an input coupling a strobe clock signal 621. The adjustable delay elements 633 and 635 couples the input coupling the strobe clock signal 621, and each of the delay elements 633 and 635 is configured to introduce a respective delay to the original strobe clock signal 621.

In various embodiments, adjustable delay element 633 and 635 are configured to generate a delayed strobe clock signal. Furthermore, although elements 633 and 635 are described as adjustable delay elements, the delay elements may also be fixed delay elements. In some embodiments, the elements 633 and 635 may represent any element that may be configured to generate strobe clock signals according to a predetermined schedule may be used. Accordingly, references herein to an adjustable delay element are not meant to be limiting.

In the example, the input of the capture flip flop 613 coupling the strobe clock signal 621 is configured to couple the input of the adjustable delay element 633. Accordingly, the output of the adjustable delay element 633 provides a first delayed strobe clock signal 623, where the first delayed strobe clock signal 623 is correlated with the strobe clock signal 621 with some additional delay added in. The first delayed strobe clock signal 623 couples the input of the adjustable delay element 635. Accordingly, the output of the adjustable delay element 635 provides a second delayed strobe clock signal 625, where the second delayed strobe clock signal 625 is correlated with the first delayed strobe clock signal 623 with some additional delay added in.

The flip flop 615 comprises two inputs, one input coupled to the delay element 611 and the second input coupled to the strobe clock signal 621. An output of the flip flop 615 couples the output 627 configured to produce the output value $S_0$. The flip flop 617 comprises two inputs, one input coupled to the delay element 611 and the second input coupled to strobe clock signal 621 by way of the delay element 633. An output of the flip flop 617 couples the output 629 configured to produce the output value $S_1$. The flip flop 619 comprises two inputs, one input coupled to the delay element 611 and the second input coupled to the strobe clock signal 621 by way of the delay elements 633 and 635. An output of the flip flop 619 couples the output 631 configured to produce the output value $S_2$.

The timing diagram 641 shows various values associated with a read word line "RWL" 643, the "RBL" 603, and the read bit line delay "RBLD" 647 during an example read operation. The example read operation uses the block diagram 601 to correlate a measured time delay to a voltage value stored in the memory cell (e.g., memory cell 205), and further to correlate the voltage value to a logical data value. The RWL 643 may be the RWL 247 (e.g., memory cell 205), and the RBLD 647 may represent values coupled to the delay line 611.

During an example read operation, subsequent to time $t_0$, RWL 643 changes state from a low value to a high value. Depending on the logical value stored as a voltage value in the memory cell, subsequent to RWL 643 going high, RBL 603 will begin to discharge. For cases where the memory cell stores a higher voltage value, the bit line will discharge faster than cases where the memory cell stores a lower voltage value.

In an example where the memory cell stores a higher voltage value, such as a voltage value $V_3$ (e.g., FIG. 4b, memory cell 205), in response to RWL 643 going high, the RBL 603 reaches a predetermined threshold 649 at or around time $t_1$. In response to the RBL 603 reaching a predetermined threshold at $t_1$, the output of the sense circuit 606 changes state. In this example, the output of the sense circuit 606 changes to a low state at or around time $t_{1.5}$. The transition to a low state at time $t_{1.5}$ is illustrated by the RBLD 647 in the timing diagram 641. The output of the sense circuit 606 cascades through the flip flop 615, and causes the output 627 of the flip flop to produce output value $S_0$ having a low value around time $t_{1.5}$.

The strobe clock signal 621 and iterations of the strobe clock signal 621 (e.g., first delayed strobe clock signal 623, second delayed strobe clock signal 625) couples the capture flip flop 613 to determine the time when the RBDL 647 changes state. In FIG. 6, the strobe clock signal 621 is programmed to fire or change state (e.g., switch from a low to a high state) during a first predetermined time window. The first predetermined time window may be set for a period between when delay $D_1$ ends and before delay $D_2$ ends. In one example, the first predetermined time window is set around time $t_{1.5}$. In another example, the first predetermined time window is set between times $t_{1.5}$ and $t_{2.5}$. The firing of the strobe clock signal 621 causes a state of the RBLD 647 to be captured at the time of the firing (e.g., time of firing around $t_{1.5}$).

In the example, where the memory cell stores a voltage value of $V_3$, the RBLD 647 transitions to a low value around time $t_{1.5}$, which falls within the delay time $D_1$ (e.g., delay spanning from $t_0$ to $t_{1.5}$). When the strobe clock signal 621 fires during the first predetermined time window, the captured value is "low" as the RBLD 647 has transitioned to a low value in response to RBL 603 transitioning to a predetermined threshold 649 at time $t_1$.

The subsequent firing of the strobe clocks, including the first delayed strobe clock signal 623 and the second delayed strobe clock signal 625 capture a low value at the outputs 629 ($S_1$) and 631 ($S_2$) of the flip flops 617 and 619, respectively. In various embodiments, the first delayed strobe clock signal 623 is programmed to fire or change state (e.g., switch from a low to a high state) during a second predetermined time window. The second predetermined time window may be set for a period between when the delay $D_2$ ends and before delay $D_3$ ends. In one example, the second predetermined time window is set around time $t_{2.5}$. In another example, the second predetermined time window is set between times $t_{2.5}$ and $t_{3.5}$. The firing of first delayed strobe clock signal 623 causes a state of the RBLD 647 to be captured at the time of the firing (e.g., time of firing around $t_{2.5}$).

Additionally, the second delayed strobe clock signal 625 is programmed to fire or change state (e.g., switch from a low to a high state) during a third predetermined time window. The third predetermined time window may be set for a period after or around when delay $D_3$ ends. In one example, the third predetermined time window is set around time $t_{3.5}$. The firing of the second delayed strobe clock signal 625 causes a state of the RBLD 647 to be captured at the time of the firing (e.g., time of firing around $t_{3.5}$).

In this example where the memory cell stores voltage value $V_3$, all three outputs 627, 629, 631 have a low value at the time the strobe clock signal 621 is fired. All three outputs 627, 629, and 631 having a low value around times $t_{1.5}$, $t_{2.5}$, and $t_{3.5}$ indicate that RBL 603 reached the predetermined threshold at time $t_1$, which correlates to a delay time $D_1$. An RBL 603 reaching a predetermined threshold within delay time $D_1$ is correlated to the memory cell 205 storing a voltage value $V_3$, which is further correlated to the binary value of 11.

Still referring to FIG. 6, in another example, the memory cell stores a lower voltage value such as $V_2$. In this example, the RBL 603 response will take longer. For example, after RWL 643 goes high around time $t_0$, in response to RWL 643 going high, RBL 603 reaches a predetermined threshold at or around time $t_2$. In response to the RBL 603 reaching a predetermined threshold at time $t_2$, the output of the sense circuit 606 changes state. In this example, the output of the sense circuit 606 changes to a low state at or around time $t_{2.5}$. The transition to a low state at time $t_{2.5}$ is illustrated by the RBDL 647 in the timing diagram 641. Around the time $t_{2.5}$, the output of the sense circuit 606 cascading through the flip flop 617 causes the output 629 of the flip flop to produce output value $S_1$ having a low value.

The strobe clock signal 621 and iterations of the strobe clock signal 621 (e.g., first delayed strobe clock signal 623, second delayed strobe clock signal 625) couples the capture flip flop 613 to determine the time when the RBDL 647 changes state. Accordingly, the strobe clock signal 621 fires around time $t_{1.5}$ to capture a state of the RBLD 647, the first delayed strobe clock signal 623 fires around time $t_{2.5}$ to capture an additional state of the RBLD 647, and the second delayed strobe clock signal 625 fires around time $t_{3.5}$ to capture another state of the RBLD 647.

In this example, where the memory cell stores voltage value $V_2$, a state of the RBLD 647 will change around time $t_{2.5}$. That is, the RBL 603 discharges within the time period delay $D_2$. Accordingly, at the time of firing of the strobe clock signal 621 (e.g., around time $t_{1.5}$) the state of the RBLD 647 has not changed. When the strobe clock signal 621 fires, the output of S0 captured around time $t_{1.5}$ is "high".

Subsequent to the firing of the strobe clock signal 621, the RBL 603 discharges and the state of the RBLD 647 changes (e.g., switches from a high to a low state). Around time $t_{2.5}$, a firing of the first delayed strobe clock signal 623 captures a state of the RBLD 647 as "low". Around time $t_{3.5}$, a firing of the second delayed strobe clock signal 625 captures a state of the RBLD 647 as "low".

In this example where the memory cell stores voltage value $V_2$, the respective values coupled to the outputs 627, 629, and 631 (e.g., $S_0$, $S_1$, and $S_2$) will have a value of 100 (e.g., "high", "low, "low") or a binary value 100. The RBLD 647 having a high value around time $t_{1.5}$, a low value around time $t_{2.5}$, and a low value around time $t_{3.5}$ indicate that RBL 603 reached the predetermined threshold at time $t_2$, which correlates to a delay time $D_2$. An RBL 603 reaching a predetermined threshold within delay time $D_2$ is correlated to the memory cell 205 storing a voltage value $V_2$, which is further correlated to the binary value 10.

Still referring to FIG. 6, in another example, the memory cell stores another lower voltage value $V_1$. In this example, the RBL 603 response will take longer than $t_1$ or $t_2$. For example, after RWL 643 goes high around time $t_0$, in response to RWL 643 going high, RBL 603 reaches a predetermined threshold at or around time $t_3$. In response to the RBL 603 reaching a predetermined threshold at time $t_3$, the output of the sense circuit 606 changes state. In this example, the output of the sense circuit 606 changes to a low state at or around time $t_{3.5}$. The transition to a low state at time $t_{3.5}$ is illustrated by the RBDL 647 in the timing diagram 641. Around time $t_{3.5}$, the output of the sense circuit 606 cascading through the flip flop 619 causes the output 631 of the flip flop to produce output value $S_2$ having a low value around time $t_{3.5}$.

The strobe clock signal 621 and iterations of the strobe clock signal 621 (e.g., first delayed strobe clock signal 623, second delayed strobe clock signal 625) couples the capture flip flop 613 to determine the time when the RBDL 647 changes state. Accordingly, the strobe clock signal 621 fires around time $t_{1.5}$ to capture a state of the RBLD 647, the first delayed strobe clock signal 623 fires around time $t_{2.5}$ to capture an additional state of the RBLD 647, and the second delayed strobe clock signal 625 fires around time $t_{3.5}$ to capture another state of the RBLD 647.

In this example, where the memory cell stores voltage value $V_1$, a state of the RBLD 647 will change around time $t_{3.5}$. That is, the RBL 603 discharges within the time period delay $D_3$. Accordingly, at the time of firing of the strobe clock signal 621 (e.g., around time $t_{1.5}$) the state of the RBLD 647 has not changed. When the strobe clock signal 621 fires, the output of S0 captured around time $t_{1.5}$ is "high".

Subsequent to the firing of the strobe clock signal 621, the RBL 603 maintains state. Around time $t_{2.5}$, a firing of the first delayed strobe clock signal 623 captures a state of the RBLD 647 as "high". Subsequent to the firing of the strobe clock signal 621, the RBL 603 discharges and the state of the RBLD 647 changes (e.g., switch from a high to a low state). Around time $t_{3.5}$, a firing of the second delayed strobe clock signal 625 captures a state of the RBLD 647 as "low".

In this example where the memory cell stores voltage value $V_1$, the respective values coupled to the outputs 627, 629, and 631 (e.g., $S_0$, $S_1$, and $S_2$) will have a value of 110 (e.g., "high", "high", "low") or a binary value 110. The RBLD 647 having a high value around time $t_{1.5}$, a high value around time $t_{2.5}$, and a low value around time $t_{3.5}$ indicate that RBL 603 reached the predetermined threshold at time $t_3$, which correlates to a delay time $D_3$. An RBL 603 reaching a predetermined threshold within delay time $D_3$ is correlated to the memory cell 205 storing a voltage value $V_1$, which is further correlated to the binary value 01.

Still referring to FIG. 6, in an example where the memory cell stores the lower voltage value $V_0$, the RBL 603 does not reach the predetermined threshold and in turn the RBLD 647 does not transition to a low value. Accordingly, the firings of the strobe clock signal 621, capture high values at the outputs 627, 629, and 631 (e.g., $S_0$, $S_1$, and $S_2$). The respective values coupled to the outputs 627, 629, and 631 are all "high" or have a binary value 111. The RBLD 647 having a binary value of 111 is correlated to the memory cell 205 storing a voltage value $V_0$, which is further correlated to the binary value 00.

Value diagram 671 illustrates the various possible values for the outputs 627, 729, and 631 (e.g., $S_0$, $S_1$, and $S_2$, respectively) after firing of the strobe clock signal 621, the first delayed strobe clock signal 623, and the second delayed strobe clock signal 625. The possible values 670 correlate to the output 627, the possible values 672 correlate to the output 629, and the possible values 674 correlate to the output 631. From these possible values, the voltage value stored in the memory cell 205 of FIG. 4a can be determined and in turn, a logical value of the data value stored in the memory cell may be determined.

Figure 7:
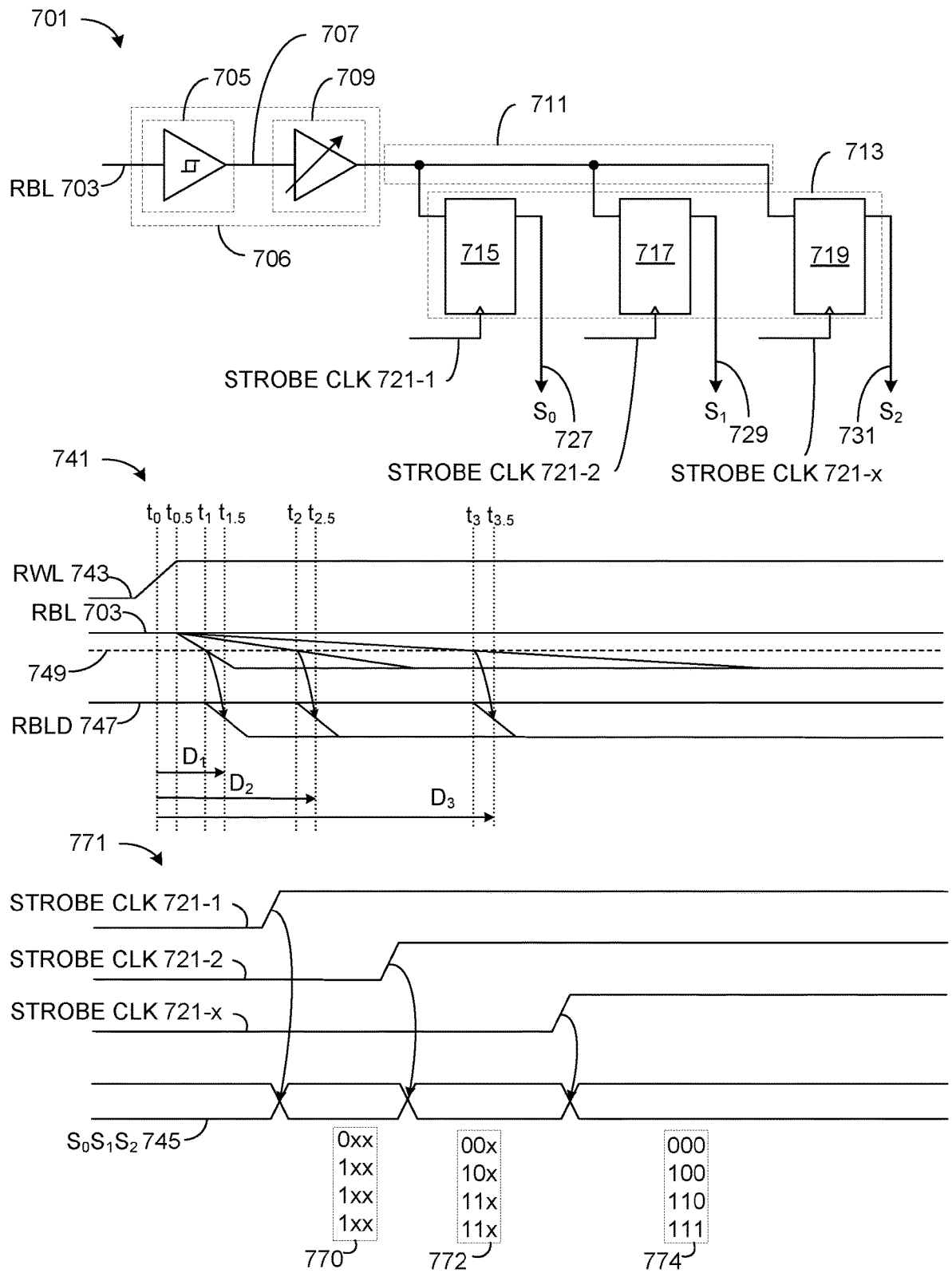
FIG. 7 shows a circuit configuration and timing diagrams for a time-to-delay measurement circuit in accordance with at least some embodiments.

Turning now to FIG. 7, an example circuit diagram in block diagram form (701) and respective timing and value diagrams (741 and 771) are illustrated. The block diagram 701 includes sense circuit 706, delay line 711, and capture flip flop 713. The block diagram 701 is configured to perform a time-to-transition method that correlates a measured delay time to a voltage value. In various embodiments, the block diagram 701 represents a time-to-transition or time-to-delay measurement circuit.

In some embodiments, the block diagram 701 is configured to operate in a manner similar to the block 521 in FIG. 5b. In some embodiments, the block diagram 701 is a Time to Digital Converter (TDC). For purposes of this description, a time-to-transition circuit may be used interchangeably with Time to Digital Converter or time-to-delay measurement circuit.

The example block diagram 701 is configured to couple a memory cell by way of an input coupled to the read bit line "RBL" 703. In various embodiments, the RBL 703 may be representative of RBL 249 as described in FIGS. 4a, 4b, and 2. In one example the block diagram 701 is coupled to a memory cell such as memory cell 205 as described in FIG. 2, where the memory cell 205 is configured to store four voltage levels representing 2 bits of data value.

The sense circuit 706 defines an input coupled to the RBL 703, a Schmitt buffer 705, an adjustable delay element 709, and an output. The delay line 711 defines an input coupled to the output of the sense circuit 706, and one or more outputs coupled to the capture flip flop 713. In one embodiment, the delay line 711 is an RC delay line that couples the output of the sense circuit 706 to the capture flip flop 713. In several embodiments, the delay line 711 is similar to the delay lines 507, 527, and 533 (FIGS. 5a, 5b, and 5c).

The capture flip flop 713 comprises a plurality of flip flops 715, 717, and 719 with respective outputs 727, 729, and 731. In the example described herein, the outputs 727, 729, and 731 respectfully couple output values $S_0$, $S_1$, and $S_2$. For example, the output value $S_0$ couples the output 727, the output value $S_1$ couples the output 729, and the output value $S_2$ couples the output 731. The capture flip flop 713 comprises a plurality of inputs coupling different strobe clock signals. For example, in FIG. 7, the capture flip flop 713 includes strobe clock signals 721-1, 721-2, and 721-x. The strobe blocks 721 are programmed such that a timing relationship between the strobe clocks 721 is based on a predetermined timing window. In FIG. 6, the example circuit 601 implements a timing relationship based on the adjustable delay elements 633 and 635. In FIG. 7, the example circuit 701 the strobe clock signals are provided as individual inputs. Aside from this different, the operation of circuit 701 (FIG. 7) is similar to circuit 601 (FIG. 6).

The timing diagram 741 shows various values associated with a read word line "RWL" 743, the "RBL" 703, and the read bit line delay "RBLD" 747 during an example read operation. The example read operation uses the block diagram 701 to correlate a measure time delay to a voltage value stored in the memory cell (e.g., memory cell 205), and further to correlate the voltage value to a logical data value.

The RWL 743 may be the RWL 237 (e.g., memory cell 205), and the RBLD 747 may represent values coupled to the delay line 711.

During an example read operation, subsequent to time $t_0$, RWL 743 changes state from a low value to a high value. Depending on the logical value stored as a voltage value in the memory cell, subsequent to RWL 743 going high, RBL 703 will begin to discharge. For cases where the memory cell stores a higher voltage value, the bit line will discharge faster than cases where the memory cell stores a lower voltage value.

In an example where the memory cell stores a higher voltage value, such as voltage value $V_3$ (e.g., FIG. 4b, memory cell 205), in response to the RWL 743 going high, the RBL 703 reaches a predetermined threshold 749 at or around time $t_1$. In response to the RBL 703 reaching a predetermined threshold at $t_1$, the output of the sense circuit 706 changes state. In this example, the output of the sense circuit 706 changes to a low state at or around time $t_{1.5}$. The transition to a low state at time $t_{1.5}$ is illustrated by the RBLD 747 in the timing diagram 741. The output of the sense circuit 706 cascades through the flip flop 715, and causes the output 727 to produce output value $S_0$ having a low value around time $t_{1.5}$.

The plurality of strobe clock signals 721 couples the capture flip flop 713 to determine the time when the RBDL 747 changes state. In FIG. 7, the strobe clock signal 721-1 is programmed to fire or change state (e.g., switch from a low to a high state) during a first predetermined time window. The first predetermined time window may be set for a period between when the delay $D_1$ ends and before delay $D_2$ ends. In one example, the first predetermined time window is set around time $t_{1.5}$. In another example, the first predetermined time window is set between times $t_{1.5}$ and $t_{2.5}$. The firing of the strobe clock signal 721-1 causes a state of the RBLD 747 to be captured at the time of the firing (e.g., time of firing around $t_{1.5}$).

In the example, where the memory cell stores a voltage value of $V_3$, the RBLD 747 transitions to a low value around time $t_{1.5}$, which falls within the delay time $D_1$ (e.g., delay spanning from $t_0$ to $t_{1.5}$). When the strobe clock signal 721-1 fires during the first predetermined time window, the captured value is "low" as the RBLD 747 has transitioned to a low value in response to RBL 703 transitioning to a predetermined threshold 749 at time $t_1$.

The subsequent firing of the strobe clocks 721-2 and 721-x capture a low value outputs 729 ($S_1$) and 731 ($S_2$) of the flip flops 717 and 719, respectively. In various embodiments, the strobe clock signal 721-2 is programmed to fire or change state (e.g., switch from a low to a high state) during a second predetermined time window. The second predetermined time window may be set for a period between when the delay $D_2$ ends and before delay $D_3$ ends. In one example, the second predetermined time window I set around time $t_{2.5}$. In another example, the second predetermined time window is set between times $t_{2.5}$ and $t_{3.5}$. The firing of strobe clock signal 721-2 causes a state of the RBLD 747 to be captured at the time of the firing (e.g., time of firing around $t_{2.5}$).

Additionally, the strobe clock signal 721-x is programmed to fire or change state (e.g., switch from a low to a high state) during a third predetermined time window. The third predetermined time window may be set for a period after or around when delay $D_3$ ends. In one example, the third predetermined time window is set around time $t_{3.5}$. The firing of the strobe clock signal 721-x causes a state of the RBLD 747 to be captured at the time of the firing (e.g., time of firing around $t_{3.5}$).

In this example where the memory cell stores voltage value $V_3$, all three outputs 727, 729, and 731 have a low value at the time the strobe clock signal 721-1 is fired. All three outputs 727, 729, and 731 having a low value around time $t_{1.5}$, $t_{2.5}$, and $t_{3.5}$ indicate that RBL 703 reached the predetermined threshold at time $t_1$, which correlates to a delay time $D_1$. An RBL 703 reaching a predetermined threshold within delay time $D_1$ is correlated to the memory cell 205 storing a voltage value $V_3$, which is further correlated to the binary value of 11.

Still referring to FIG. 7, in another example, the memory cell stores a lower voltage value such as $V_2$. In this example, the RBL 703 response will take longer. For example, after RWL 743 goes high around time $t_0$, in response to RWL 743 going high, RBL 703 reaches a predetermined threshold at or around time $t_2$. In response to the RBL 703 reaching a predetermined threshold at time $t_2$, the output of the sense circuit 706 changes state. In this example, the output of the sense circuit 706 changes to a low state at or around time $t_{2.5}$. The transition to a low state at time $t_{2.5}$ is illustrated by the RBDL 747 in the timing diagram 741. Around time $t_{2.5}$, the output of the sense circuit 706 cascading through the flip flop 717 causes the output 729 of the flip flop to produce output value $S_1$ having a low value.

The strobe clock signals 721 couple the capture flip flop 713 to determine the time when the RBDL 747 changes state. Accordingly, the strobe clock signal 721-1 fires around time $t_{1.5}$ to capture a state of the RBLD 747, the strobe clock signal 721-2 fires around time $t_{2.5}$ to capture an additional state of the RBLD 747, and the strobe clock signal 721-x fires around time $t_{3.5}$ to capture another state of the RBLD 747.

In this example, where the memory cell stores voltage value $V_2$, a state of the RBLD 747 will change around time $t_{2.5}$. That is, the RBL 703 discharges within the time period delay $D_2$. Accordingly, at the time of firing of the strobe clock signal 721-1 (e.g., around time $t_{1.5}$) the state of the RBLD 747 has not changed. When the strobe clock signal 721-1 fires, the output of S0 captured around time $t_{1.5}$ is "high".

Subsequent to the firing of the strobe clock signal 721-1, the RBL 703 discharges and the state of the RBLD 747 changes (e.g., switches from a high to a low state). Around time $t_{2.5}$, a firing of the strobe clock signal 721-2 captures a state of the RBLD 647 as "low". Around time $t_{3.5}$, a firing of the strobe clock signal 721-x captures a state of the RBLD 647 as "low".

In this example where the memory cell stores voltage value $V_2$, the respective values coupled to the outputs 727, 729, and 731 (e.g., $S_0$, $S_1$, and $S_2$) will have a value of 100 (e.g., "high", "low, "low") or a binary value 100. The RBLD 747 having a high value around time $t_{1.5}$, a low value around time $t_{2.5}$, and a low value around time $t_{3.5}$ indicate that RBL 703 reached the predetermined threshold at time $t_2$, which correlates to a delay time $D_2$. An RBL 703 reaching a predetermined threshold within delay time $D_2$ is correlated to the memory cell 205 storing a voltage value $V_2$, which is further correlated to the binary value 10.

In this example where the memory cell stores voltage value $V_2$, the respective values coupled to the outputs 627, 629, and 631 (e.g., $S_0$, $S_1$, and $S_2$) will have a value of 100 (e.g., "high", "low, "low") or a binary value 100. The RBLD 647 having a high value around time $t_{1.5}$, a low value around time $t_{2.5}$, and a low value around time $t_{3.5}$ indicate that RBL 603 reached the predetermined threshold at time $t_2$, which correlates to a delay time $D_2$. An RBL 603 reaching a predetermined threshold within delay time $D_2$ is correlated to the memory cell 205 storing a voltage value $V_2$, which is further correlated to the binary value 10.

Still referring to FIG. 7, in another example, the memory cell stores another lower voltage value $V_1$. In this example, the RBL 703 response will take longer than $t_1$ or $t_2$. For example, after RWL 743 goes high around time $t_0$, in response to RWL 743 going high, RBL 703 reaches a predetermined threshold at or around time $t_3$. In response to the RBL 703 reaching a predetermined threshold at time $t_3$, the output of the sense circuit 706 changes state. In this example, the output of the sense circuit 706 changes to a low state at or around time $t_{3.5}$. The transition to a low state at time $t_{3.5}$ is illustrated by the RBDL 747 in the timing diagram 741. Around time $t_{3.5}$, the output of the sense circuit 706 cascading through the flip flop 719 causes the output 731 of the flip flop to produce output value $S_2$ having a low value around time $t_{3.5}$.

The strobe clock signals 721 couple the capture flip flop 713 to determine the time when the RBDL 747 changes state. Accordingly, the strobe clock signal 721-1 fires around time $t_{1.5}$ to capture a state of the RBLD 747, the strobe clock signal 721-2 fires around time $t_{2.5}$ to capture an additional state of the RBLD 747, and the strobe clock signal 721-x fires around time $t_{3.5}$ to capture another state of the RBLD 747.

In this example, where the memory cell stores voltage value $V_1$, a state of the RBLD 747 will change around time $t_{3.5}$. That is, the RBL 703 discharges within the time period delay $D_3$. Accordingly, at the time of firing of the strobe clock signal 721-1 (e.g., around time $t_{1.5}$) the state of the RBLD 747 has not changed. When the strobe clock signal 721-1 fires, the output of S0 captured around time $t_{1.5}$ is "high".

Subsequent to the firing of the strobe clock signal 721-1, the RBL 703 maintains state. Around time $t_{2.5}$, a firing of the strobe clock signal 721-2 captures a state of the RBLD 747 as "high". Subsequent to the firing of the strobe clock signal 721-2, the RBL 703 discharges and the state of the RBLD 747 changes (e.g., switch from a high to a low state). Around time $t_{3.5}$, a firing of the strobe clock signal 721-x captures a state of the RBLD 647 as "high".

In this example where the memory cell stores voltage value $V_3$, the respective values coupled to the outputs 727, 729, and 731 (e.g., $S_0$, $S_1$, and $S_2$) will have a value of 110 (e.g., "high", "high", "low") or a binary value 110. The RBLD 747 having a high value around time $t_{1.5}$, a high value around time $t_{2.5}$, and a low value around time $t_{3.5}$ indicate that RBL 703 reached the predetermined threshold at time $t_3$, which correlates to a delay time $D_3$. An RBL 703 reaching a predetermined threshold within delay time $D_3$ is correlated to the memory cell 205 storing a voltage value $V_1$, which is further correlated to the binary value 01.

Still referring to FIG. 7, in an example where the memory cell stores the lower voltage value $V_0$, the RBL 703 does not reach the predetermined threshold and in turn the RBLD 747 does not transition to a low value. Accordingly, the firings of the strobe clock signals 721, capture high values at the output 727, 729, and 731 (e.g., $S_0$, $S_1$, and $S_2$). The respective values coupled to the outputs 727, 729, and 731 are all "high" or have a binary value 111. The RBLD 747 having a binary value of 111 is correlated to the memory cell 205 storing a voltage value $V_0$, which is further correlated to the binary value 00.

Value diagram 771 illustrates the various possible values for the outputs 727, 729, and 731 (e.g., $S_0$, $S_1$, and $S_2$, respectively) after firing of the strobe clock signals 721. The possible values 770 correlate to the output 727, the possible values 772 correlate to the output 729, the possible values 774 correlate to the output 731. From these possible values, the voltage value stored in the memory cell 205 of FIG. 4a can be determined and in turn, a logical value of the data value stored in the memory cell may be determined.

Figure 8A:
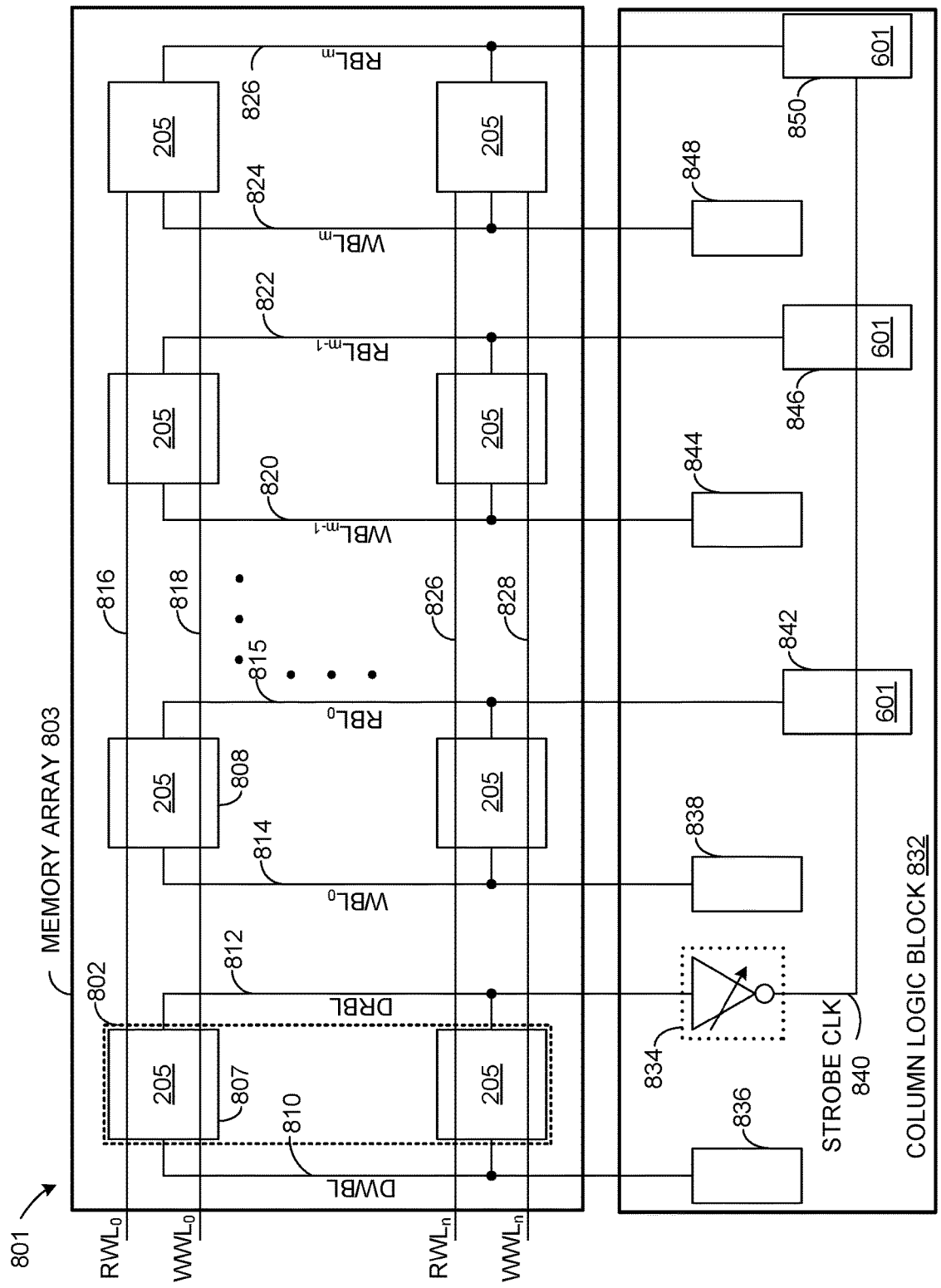
FIG. 8a shows, in block diagram form, a circuit in accordance with at least some embodiments.

FIG. 8a illustrates in block diagram form, a building block 801 comprising a plurality of 3T DRAM bit cells, such as the 3T DRAM memory cell 205 described in FIG. 2. The building block 801 is configured to use a single read operation to determine values in a plurality of memory cells. In one embodiment, the building block 801 reads the plurality of memory cells in a manner described herein, and generates a combined value comprising the several values of the plurality of memory cells.

The building block 801 comprises a two dimensional memory array 803 and a column logic block 832. The two dimensional memory array 803 comprises a plurality of memory cells. In this example, the plurality of memory cells are 3T DRAM memory cells, such as memory cell 205 described in FIG. 2. The memory cells define one or more rows and one or more columns. Additionally, each of the memory cells is coupled to a read word line $RWL_0$ 816, . . . , $RWL_n$ 826. In the memory array 803, a horizontal row of memory cells may be coupled to a single read word line. Additionally, each of the horizontal rows of memory cells may also be coupled to a respective write word line, $WWL_0$ 818, . . . , $WWL_n$ 828.

Additionally, each of the columns of memory cells may be coupled to a respective write bit line DWBL 810, $WBL_0$ 814, . . . , $WBL_{m-1}$, $WBL_m$ 822. Each of the columns of memory cells may also be coupled to a respective read bit line DRBL 812, $RBL_0$ 815, . . . , $RBL_{m-1}$ 822, $RBL_m$ 826. The row and column designations are interchangeable between the word lines and bit lines. The word lines and bit lines are orthogonal with respect to each other.

In the memory array 803, one of the columns of memory cells is defined as a tracking block. In FIG. 8a and memory array 803, the tracking block 802 is defined by the left-most column of memory cells.

The column logic block 832 comprises column write logic 836, 838, 844, and 848, a plurality of time-to-transition measurement circuits 842, 846, and 850, and an adjustable delay element 834. The adjustable delay element 834 is coupled to the tracking memory block 802. In various embodiments, the time-to-transition measurement circuits 842, 846, and 850 each, are similar to the circuit 601 discussed in FIG. 6.

In the building block 801, individual columns of memory cells are coupled to a column write logic (e.g., by way of a write bit line) and a time-to-transition measurement circuit (e.g., by way of a read bit line). In FIG. 8a, the tracking block 802 couples the column write logic 836 (e.g., by way of DWBL 810) and the adjustable delay element 834 (e.g., by way of the DRBL 812). The next column in the memory array 803 couples the column write logic 838 (e.g., by way of WBL 814) and the time-to-transition measurement circuit 842 (e.g., by way of RBL 815).

The next column in the memory array 803 couples the column write logic 844 (e.g., by way of WBL 820) and the time-to-transition measurement circuit 846 (e.g., by way of RBL 822). Finally, the right-most column in the memory array 803 couples the column write logic 848 (e.g., by way of WBL 824) and the time-to-transition measurement circuit 850 (e.g., by way of RBL 826). In this manner, the memory array 803 couples the column logic block 832.

During operation of the building block 801, a strobe clock signal 840 is provided to the time-to-transition measurement circuits 842, 846, and 850 by the adjustable delay element 834. The adjustable delay element 834 in one example, is an inverter with adjustable delay.

During operation of the building block 801, various values are read out by the column logic block 832. In some embodiments, the column logic block 832 is configured to determine several values using one read operation and providing an output equal to a combination of the several values, referred to herein as a "combined value". In other embodiments, the column logic block 832 is configured to determine several values simultaneously to provide a combined value.

With respect to the possible voltage values that may be stored in a memory cell, FIGS. 4a and 4b illustrate possible values as a bell curve. Each bell curve captures a potential distribution of voltage values that may correspond to a respective logical value stored in the memory cell 205. For example, the memory cell 205 discussed in FIG. 4a, had eight possible voltage values $V_0, V_1, V_2, V_3, V_4, V_5, V_6$, and $V_7$, and FIG. 4b, has four possible voltage values $V_0, V_1, V_2$, and $V_3$.

The tracking block 802 is configured to determine values stored in the several memory cells. The tracking block 802 comprises several tracking memory cells that define the left-most memory column in FIG. 8a. In this example a tracking memory cell may be configured for each memory row. In another embodiment a tracking memory cell may be configured for all of the array of bit cells. And in another embodiment, tracking block 802 can be interspersed within the memory array increasing the number of tracking columns available in the memory array. There is a tradeoff in area efficiency with increased tracking columns. For example, a tracking block may be used for every "K" column of memory cells.

In FIG. 8a, the tracking block 802 is the tracking memory cell column and the memory cell 807 is a tracking memory cell. The tracking memory cell stores a predetermined threshold based on the possible voltage values that may be stored by a memory cell in the memory array 803. For example, if the memory cell 205 is configured to store four possible voltage values $V_0, V_1, V_2$, and $V_3$, the tracking cell 807 may store either $V_1, V_2$, or $V_3$ as a predetermined threshold.

In one example where the memory cell 205 can store four different values, the tracking cell 807 is configured to store a predetermined threshold that tracks the voltage $V_3$. In another example where the memory cell 205 can store eight different values, the tracking cell 807 is configured to store a predetermined threshold that tracks the voltage $V_7$. In these examples, the tracking cell 807 is configured to store voltage values representing a higher possible value that may be stored by the memory cells in the memory array 803. The voltage values $V_3$ and $V_7$ are the higher voltage value being stored. Prior to a read operation, the relevant voltage value may be programmed into the tracking cell.

During operation, in response to $RWL_0$ 816 going high, the DRBL 812 coupled to the output of the memory cell 807 reaches a predetermined threshold at time $t_1$. The time $t_1$ correlates with the time delay $D_1$ (e.g., a time-to-transition determination) as discussed in FIGS. 4a and 4b. In response to DRBL 812 reaching the predetermined threshold time, the adjustable delay element 834 coupled to DRBL 812 couples the strobe clock signal 840 to the time-to-transition measurement circuits 842, 846, and 850. The strobe clock signal 840 fires after time $t_1$.

The output of the memory cells 205 coupled to the read word line $RWL_0$ 816 are correlated to a voltage value and in turn to a logical data value with respect to the tracking memory cell 807. The output of the tracking cell 807 provides a time reference value and a time-to-transition determination. The time reference value and the time-to-transition determination with respect to the tracking cell 807 is used to correlate the voltage value and in turn to a logical value for all the other memory cells coupled to the same read word line $RWL_0$ 816 as the tracking cell 807. The time reference value and time-to-transition determination with respect to a tracking cell in the tracking column 802 is used to correlate the voltage value to a logical value for all the other memory cells coupled to the same read word line as the tracking cell 807 in the tracking column 802.

Figure 8B:
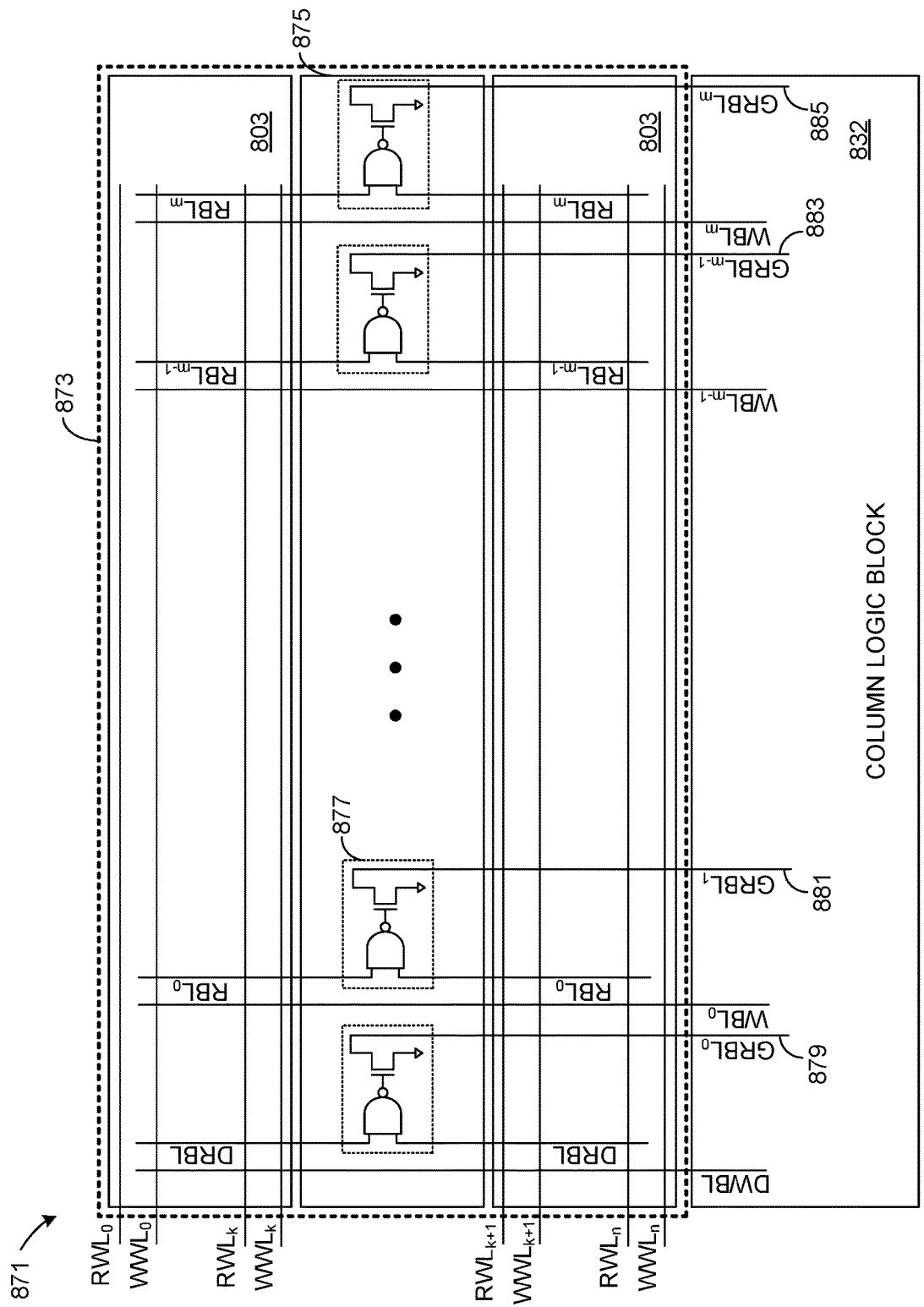
FIG. 8b shows, in block diagram form, a circuit in accordance with at least some embodiments.

Turning now to FIG. 8b, a hierarchical bit line circuit 871 is shown. The circuit 871 defines a plurality of local column logic blocks 873 coupling the column logic block 832. In this example, horizontal rows of the block 873 define individual column logic blocks. For example, local column logic block 875 is illustrated in FIG. 8b. The local column logic block 875 couples a local bit line to a global bit line. In the circuit 871, a plurality of memory cells such as the memory cell 205 are coupled to one or more bit lines, and one or more word lines. Individual read bit lines are coupled to global read bit lines "GRBL" by way of a global bit line driver 877.

As recognized by one of ordinary skill in the art, during operation of a memory array, time delay is a product of resistance and capacitance. As either resistance or capacitance increases, there will be a resulting increase in time delay. For example, the resistance of the memory cell 205 is high at $V_1$ in FIGS. 4a and 4b. Additionally, with shrinking geometries in process technology, wire capacitances are increasing.

In various embodiments, as the number of memory cells in a row increases, a delay along the read bit line increases. Increasing the number of entries increases the bit line length, where a stronger bit line driver may be used to drive a signal through the longer bit line. An increased delay along the read bit line results in increasing the time required to read a memory cell in the memory array.

The circuit 871 is configured to decrease the time used to read a memory cell in the array, by shortening a wire length. For example, the circuit 871 shortens a length of a bit line by implementing a hierarchical bit line structure including a local bit line and a global bit line.

Figure 8C:
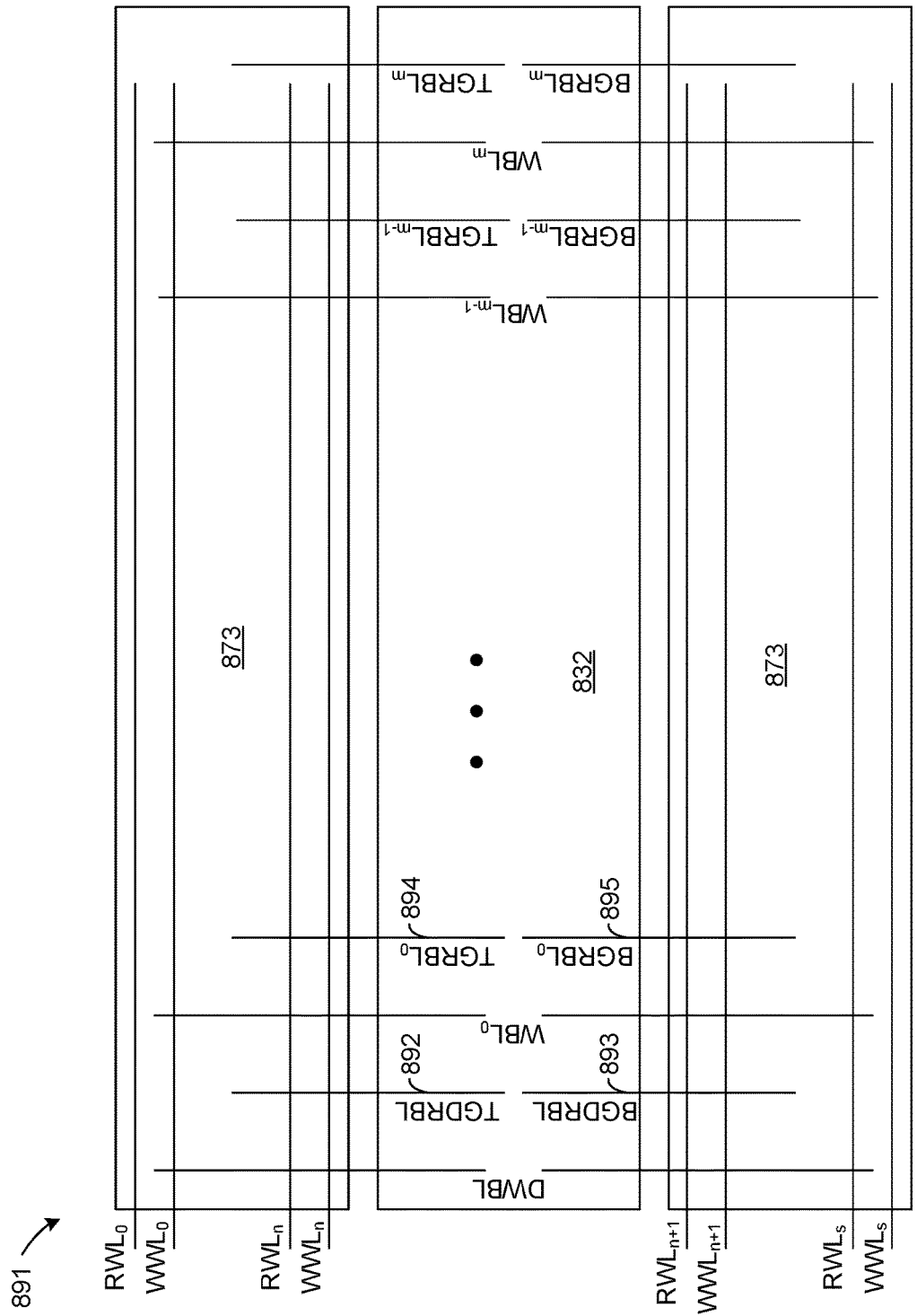
FIG. 8c shows, in block diagram form, a circuit in accordance with at least some embodiments.

Turning now to FIG. 8c, the block diagram 891 illustrates an embodiment of a hierarchical bit line memory with top and bottom global bit lines 894 and 895 coupled to the column logic block 832. This embodiment further reduces the wire length of the global bit line to improve the memory read time required.

Figure 9:
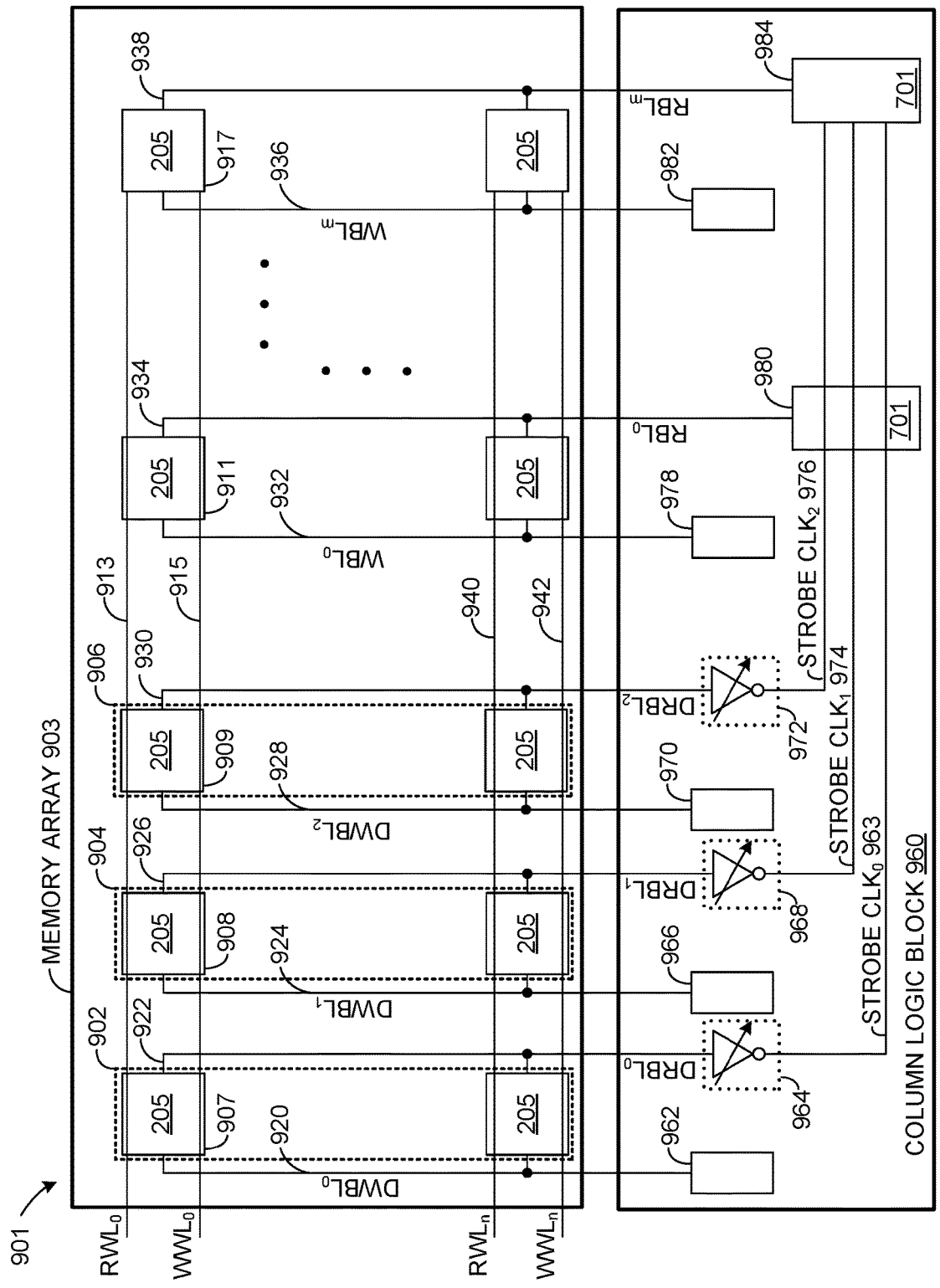
FIG. 9 shows, in block diagram form, a circuit in accordance with at least some embodiments.

Turning now to FIG. 9 block diagram 901 comprises a plurality of 3T DRAM bit cells, such as the 3T DRAM memory cell 205 described in FIG. 2. The block 901 comprises a two dimensional memory array 903 having a plurality of memory cells. The memory array 903 may be read using techniques described herein.

In the memory array 903, one or more rows shown as word lines $RWL_0$ 913, . . . , $RWL_n$ 940, and $WWL_0$ 915, . . . , $WWL_n$ 942, and one or more columns shown as bit lines $DWBL_0$ 920, $DRBL_0$ 922, $DWBL_1$ 924, $DRBL_1$ 926, $DWBL_2$ 928, $DRBL_2$ 930, $WBL_0$ 932, . . . , $WBL_m$ 936, and $RBL_0$ 934, . . . , $RBL_m$ 938. The row and column designations are interchangeable between the word lines and bit lines. The word lines and bit lines are orthogonal with respect to each other.

In the memory array 903, columns 902, 904, and 906 define tracking memory cell columns. Additionally, the memory cells 907, 908, and 909 are tracking memory cells.

The column logic block 960 may comprise column write logic 962, 966, 970, 978, and 982 and time-to-transition measurement circuits 980 and 984, where the time-to-transition measurement circuits are like circuit 701 discussed in FIG. 7. The column logic block 960 also comprises adjustable delay elements 964, 968, and 972, which drive the strobe clock signals 963, 974, and 976, respectively. The adjustable delay elements 964, 968, and 972 are coupled to the time-to-transition measurement circuits 980 and 984. The adjustable delay elements, in one example, are inverters with adjustable delay.

During operation of the block 901, various values are read out by the column logic block 960. In some embodiments, the column logic block 960 is configured to determine several values using one read operation and providing an output equal to a combination of several values, referred to herein as a "combined value". In other embodiments, the column logic block 960 is configured to determine several values simultaneously to provide a combined value.

With respect to the possible voltage values that may be stored in a memory cell, FIGS. 4a and 4b illustrate possible values as a bell curve. Each bell curve captures a potential distribution of voltage values that may correspond to a respective logical value stored in the memory cell 205. For example, the memory cell 205 discussed in in FIG. 4a, had eight possible voltage values $V_0, V_1, V_2, V_3, V_4, V_5, V_6,$ and $V_7$, and FIG. 4b, has four possible voltage values $V_0, V_1, V_2,$ and $V_3$.

The tracking columns 902, 904, and 906 are configured to determine values stored in the several memory cells. In this example a tracking memory cell may be configured for each memory row. In another embodiment a tracking memory cell may be configured for all of the array of bit cells. And in another embodiment, tracking columns or rows can be interspersed within the memory array increasing the number of tracking columns available in the memory array. There is a tradeoff in area efficiency with increased tracking columns. For example, a tracking block may be used for every "K" column of memory cells.

In FIG. 9, the tracking memory cell stores a predetermined threshold based on the possible voltage values that may be stored by a memory cell in the memory array 903. For example, if the memory cell is configured to store four possible voltage values $V_0, V_1, V_2,$ and $V_3$, the tracking cells 907, 908, and 909 may store either $V_1$, $V_2$, or $V_3$ as a predetermined threshold.

In one example, where a memory cell can store four different values, the tracking cell 907 is configured to store a predetermined threshold that tracks the voltage $V_3$. In another example where the memory cell can store eight different values, the tracking cell 907 is configured to store a predetermined threshold that tracks the voltage $V_7$. In these examples, the tracking cell 907 is configured to store voltage values representing the higher possible value that may be stored by the memory cells in the memory array 903. Prior to a read operation, the relevant voltage value may be programmed into the tracking cell.

During operation, in response to $RWL_0$ 913 going high, the $DRBL_0$ 922 coupled to the output of the memory cell 907 reaches a predetermined threshold at time $t_1$. The time $t_1$ correlates with the time delay $D_1$ (e.g., a time-to-transition determination) as discussed in FIGS. 4a and 4b. In response to $DRBL_0$ 922 reaching the predetermined threshold, the adjustable delay element 964 coupled to $DRBL_0$ 922 couples the strobe clock signal 963 to the time-to-transition measurement circuits 980 and 984. The strobe clock signal 963 fires after time $t_1$. The time-to-transition measurement circuits are coupled to read bit lines $RBL_0$ 934 and $RBL_m$ 938, respectively.

In this example of block 901, the memory cell 205 discussed in FIG. 4b is used. In examples where the memory cell 205 stores eight values (e.g., FIG. 4a), four tracking cells may be used and a binary search method may be used to determine values in the memory cells. For example, the four tracking cells may store values tracking $V_7, V_5, V_3,$ and $V_1$. In other examples, the number of tracking cells may track the number of possible voltage values that may be stored in a memory cell. For example, where the memory cell may store 8 different values, the number of tracking cells may be seven or eight. Any number of tracking cells may be used, where the use of a binary search method may reduce the number of tracking cells used.

In various embodiments, the tracking cell 908 is configured to store a predetermined threshold that tracks the voltage $V_2$. Additionally, the tracking cell 909 is configured to store a predetermined threshold that tracks the voltage $V_1$. In this example, the tracking cells 907, 908, and 909 store voltage value $V_1, V_2,$ and $V_3$, respectively. The total number of tracking cells using in the memory array 902 is 3. In this example, where n is the number of bits that may be stored in a memory cell, $2^n-1$ number of tracking cells may be used to read the memory array. In examples where a binary search method is used, where n is the number of bits that may be stored in a memory cell, $\log_2 n$ number of tracking cells may be used to read the memory array.

In response to the $RWL_0$ 913 going high, the $DRBL_1$ 926 coupled to the output of the tracking cell 908 reaches a predetermined threshold at time $t_2$. The time $t_2$ correlates with time delay $D_2$ (e.g., a time-to-transition determination) as discussed in FIGS. 4a and 4b. In response to $DRBL_1$ 926 reaching the predetermined threshold, the adjustable delay element 968 coupled to $DRBL_1$ 926 couples the strobe clock signal 974 to the time-to-transition measurement circuits 980 and 984. The strobe clock signal 974 fires after time $t_2$.

Similarly, the $DRBL_2$ 930 reaches a predetermined threshold around time $t_3$. The time $t_3$ correlates with time delay $D_3$ (e.g., a time-to-transition determination) as discussed in FIGS. 4a and 4b. In response to the $DRBL_2$ 930 reaching the predetermined threshold, the adjustable delay element 972 coupled to $DRBL_2$ 930 couples the strobe clock signal 976 to the time-to-transition measurement circuits 980 and 984. The strobe clock signal 976 fires after time $t_3$. The time-to-transition measurement circuits 980 and 984 correlate the time delay to transition as discussed in FIG. 7. The tracking cells 907, 908, and 909 in the respective tracking columns 902, 904, and 906 provide the strobe clock to the time-to-transition measurement circuit and in turn a determination is made of values stored in the memory array 903.

Figure 10:
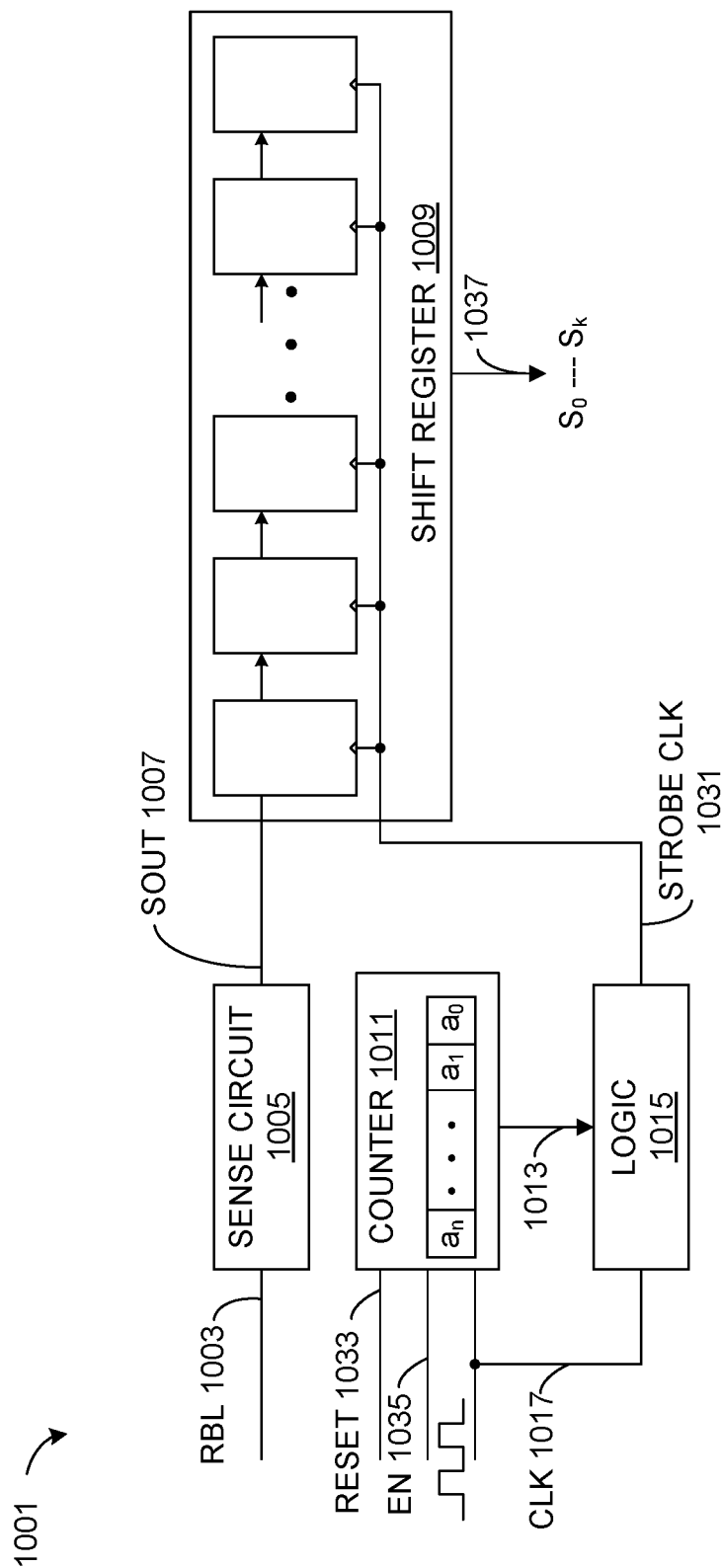
FIG. 10 shows, in block diagram form, a time-to-transition measurement circuit in accordance with at least some embodiments.

In FIG. 10, the example block 1001 may be used to correlate a measured delay time to a stored voltage value. One of the read operations previously discussed includes a time-to-transition method that correlates a measured delay time to a voltage value. The block 1001 comprises a sense circuit 1005, a counter 1011, a logic 1015, and a shift register 1009.

The sense circuit 1005 is configured to sense that RBL 1003 has reached a predetermined threshold voltage value. The sense circuit 1005 may be a comparator with a reference voltage, a skewed inverter with a skewed trip point voltage or a Schmitt trigger. In response to the RBL 1003 reaching a predetermined threshold, the output SOUT 1007 of the sense circuit changes value (e.g., transitions to a high value or to a low value). This change in the SOUT value 1007 is captured by the shift register 1009.

The shift register 1009 is clocked by STROBE CLK 1031. The STROBE CLK 1031 is output from a programmable logic 1015. The inputs to the LOGIC 1015 are clock CLK 1017 and output of the counter 1011. The CLK 1017 is the primary clock to the memory. The counter 1011 also receives the primary clock 1017 and also has inputs EN 1035 and RESET 1033.

The enable EN 1035 enables the counter 1011 to start counting during the read operation and the reset 1033 resets the counter to a default value after the read operation has completed. The LOGIC 1015 is programmed to send a clock pulse to STROBE CLK 1031 when a predetermined condition is met. For example, this condition may occur when the counter 1011 has reached a predetermined number of count values. These count values may be determined by the number of possible voltage values stored in the memory cell that is being read. In one example, the EN signal 1035 is output to a tracking column and the memory cell in the tracking column is configured to store a predetermined threshold that tracks a voltage.

The shift register 1009 has K+1 outputs and therefore requires a K+1 number of clock pulses to capture the SOUT 1007 value. The number of K+1 clock pulses may spread out over r clock cycles, where r times the number of clock cycle time periods is greater than largest time delay used by the SOUT 1007 to transition from when a word line is enabled to read a memory cell. In another embodiment, the clock 1017 may be a locally generated clock that uses a ring oscillator circuit to track memory processes and operating conditions.

Figure 11:
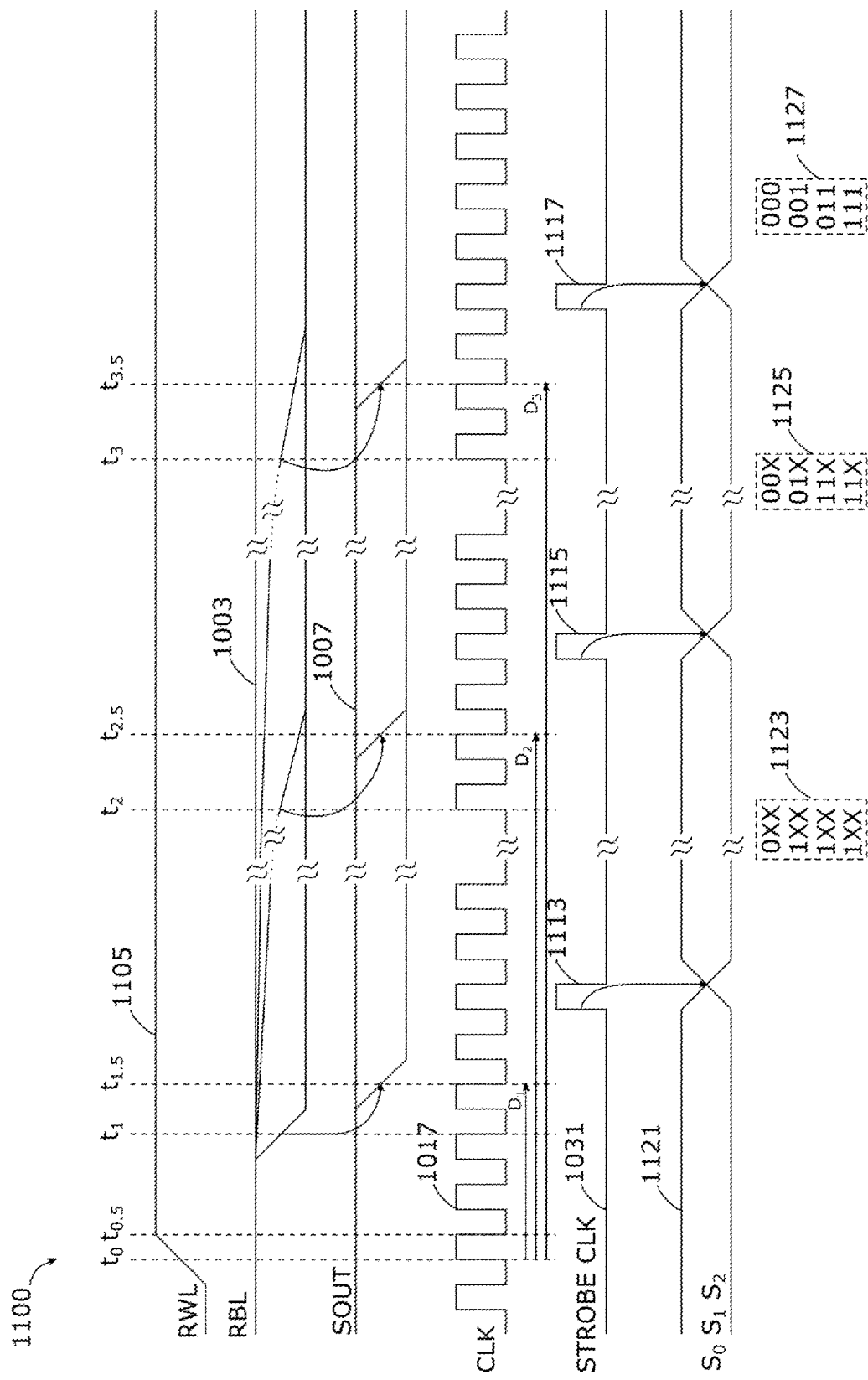
FIG. 11 shows a timing diagram in accordance with at least some embodiments.

Turning now to FIG. 11, graph 1100 shows a timing diagram associated with an example read operation. During an example read operation, the block 1001 couples an output of a memory cell capable of storing four possible voltage values. The memory cell may be a memory cell 205 discussed in FIG. 4b or any other type of memory cell including non-volatile memory cell capable of storing more than two possible voltage values.

The timing diagram 1100 illustrates values associated with an RWL 1005, RBL 1003, SOUT 1007, CLK 1017, STROBE VLK and $S_0$, $S_1$, and $S_2$. The RBL 1003 is coupled to a memory cell storing four possible data values. The four possible data values correlate to four possible impedance value of the memory cell, where each impedance value is associated with a respective time-to-transition of the memory cell during a read operation.

In the timing diagram 1100, initially the RWL 1105 changes state, in this example, goes high. In one example, where the memory cell stores the value $V_3$, in response to the RWL 1105 going high, the bit line RBL 1003 reaches a predetermined threshold at time $t_1$. Furthermore, the sense output SOUT 1007 transitions low at time $t_{1.5}$ in response to the RBL 1003 reaching the predetermined threshold at time $t_1$. The LOGIC 1015 in FIG. 10 is programmed to send a clock pulse 1113 to the STROBE CLK 1031 after time $t_{1.5}$ to capture the value of the SOUT 1007. The shift register 1009 in FIG. 10 captures a value of "low" on the SOUT 1007. Subsequent clock pulses 1115, and 1117 are sent to the STROBE CLK 1031 (e.g., after time $t_2$ and $t_3$) and the shift register 1009 (FIG. 10) captures values of "low" on the SOUT 1007.

The shift register 1009 shifts in the low values to the registers in the shift register. The shift register 1009 in FIG. 10 is 3 bits wide to measure a memory cell with four possible impedance value and three clock pulses 1113, 1115, and 1117 are used for the STROBE CLK 1031. In the example, the output of the shift registers after the clock pulse 1117 are zeros (e.g., "0 0 0").

In another example, initially the RWL 1005 changes state, goes high. In this example, the memory cell stores the value $V_2$. In response to the RWL 1105 going high, the bit line RBL 1003 reaches a predetermined threshold at time $t_2$. Furthermore, the sense output SOUT 1007 transitions low at time $t_{2.5}$ in response to the RBL 1003 reaching the predetermined threshold at time $t_2$.

The LOGIC 1015 (FIG. 10) sends the clock pulse 1113 to the STROBE CLK 1031 after time $t_{1.5}$ to capture the value of the SOUT 1007 around time $t_1$. The shift register 1009 (FIG. 10) captures a value of "high" on the SOUT 1007 and stores the "high" value in the 3 bit wide shift register. The subsequent clock pulse 1115 is sent to STROBE CLK 1031 after $t_{2.5}$ to capture a low value in the 3 bits wide shift register and shifts the high value captured by clock pulse 1113 further into the shift register. The subsequent clock pulse 1117 is sent to STROBE CLK 1031 after $t_{3.5}$ to capture a low value in the 3 bit wide shift register and shifts the high value captured by clock pulse 1113 further into the shift register. In this example, the output of the shift registers after the clock pulse 1117 is "0 0 1" in binary format.

In a third example, initially the RWL 1005 changes state, goes high. In this example, the memory cell stores the value $V_1$. In response to the RWL 1105 going high, the bit line RBL 1003 reaches a predetermined threshold at time $t_3$. Furthermore, the sense output SOUT 1007 transitions low at time $t_{3.5}$ in response to the RBL 1003 reaching the predetermined threshold at time $t_3$.

The LOGIC 1015 (FIG. 10) sends the clock pulse 1113 send to the STROBE CLK 1031 after time $t_{1.5}$ to capture the value of the SOUT 1007 around time $t_1$. The shift register 1009 (FIG. 10) capture a value of "high" on the SOUT 1007 and stores the "high" value in the 3 bit wide shift register. The subsequent clock pulse 1115 is sent to STROBE CLK 1031 after $t_{2.5}$ to capture a high value in the 3 bits wide shift register and shifts the high value captured by clock pulse 1113 further into the shift register. The subsequent clock pulse 1117 is sent to STROBE CLK 1031 after $t_{3.5}$ to capture a low value in the 3 bit wide shift register and shifts the high value captured by clock pulse 1113 further into the shift register. In this example, the output of the shift registers after the clock pulse 1117 is "0 1 1" in binary format.

In another example, the memory cells stores the value $V_0$. Initially, the RWL 1105 changes state, goes high. In response to the RWL 1105 going high, the bit line RBL 1003 maintains state and does not reach a predetermined threshold at times $t_3$, $t_2$, or $t_1$. The sense output SOUT 1007 does not transition at time $t_{3.5}$. Accordingly, all three clock pulses 1113, 1115, and 1117 capture a high value of SOUT 1007 and the output of the 3 bit wide shift register after the clock pulse 1117 would be "1 1 1" in binary format. The various possible values 1123 of the shift register outputs $S_0S_1S_2$ after clock pulse 1113 is shown if FIG. 11. The various possible values 1125 shows the possible values after clock pulse 1115, and the various possible values 1127 shows the possible values after clock pulse 1117.

Figure 12:
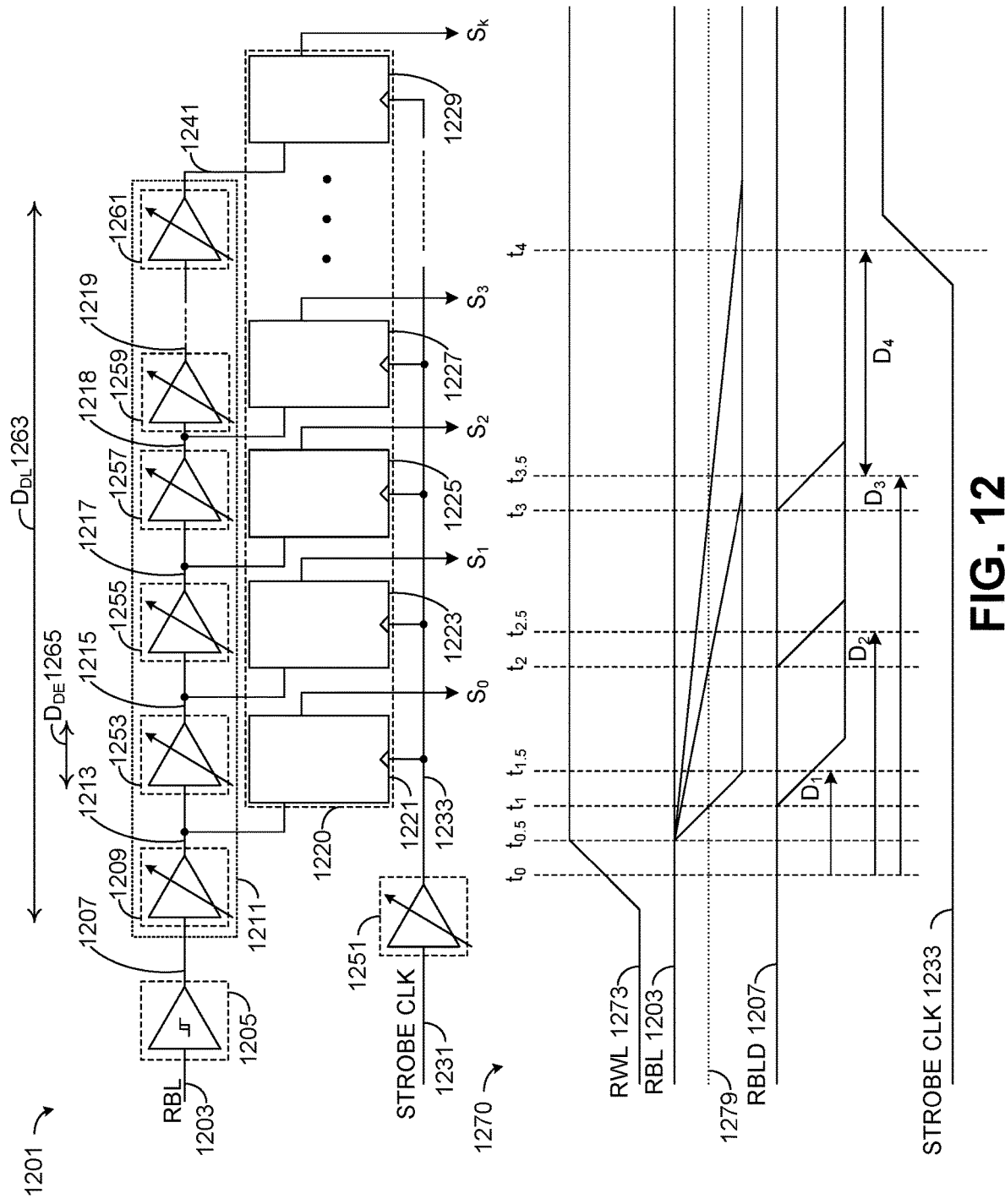
FIG. 12 shows, in block diagram from, a time-to-transition measurement circuit and timing diagrams in accordance with at least some embodiments.

FIG. 12 illustrates an example circuit diagram 1201 of the block 501 (FIG. 5*a*). The circuit diagram 1201 illustrates a circuit diagram for performing a time-to-transition measurement. In various embodiments, the circuit diagram 1201 is a Time to Digital Converter (TDC), which may be used interchangeably with time-to-transition circuit or time-to-transition measurement circuit, herein.

The example circuit 1205 is coupled to the memory cell 205 discussed in FIG. 4*b* and the memory cell stores four voltage levels representing 2 bits of data value. The sense circuit 503 (FIG. 5*a*) is represented by the Schmitt buffer 1205. The Schmitt buffer 1205 couples RBL 1203 which defines an output of the memory cell 205 described in FIG. 4*b*. The delay line 1211 is a delay line coupling the output of the sense circuit to the capture flip flop 1220. The delay line 1211 comprises a plurality of adjustable delay elements 1209, 1253, 1255, 1257, 1259, and 1261.

In one embodiment, the delay element is a non-inverting delay element. In other embodiments, the delay element is an inverting delay element. The capture flip flop 1220 comprises a plurality of flip flops 1221, 1223, 1225, 1227, and 1229 with respective outputs $S_0$, $S_1$, $S_2$, $S_3$, and $S_k$. The strobe clock signal 1231 is coupled to an input of the adjustable delay element 1251 and the output of the adjustable delay element 1251 generates a delayed strobe clock signal 1233 in response to the strobe clock signal 1231 at the input. The output of each adjustable delay element in the delay line 1211 is coupled to a successive adjustable delay element and input of the corresponding capture flip flop. In response to firing the strobe clock signal 1231, output values of the all the delay elements in the delay line 1211 are concurrently captured by the capture flip flop 1220.

The timing graph 1270 shows various values associated with a time-to-transition measurement occurring during a read operation. Various methods have been described herein for correlating the measured time delay to a voltage value stored in the memory cell, and in turn correlating the voltage value to a logical data value. During a read operation and performance of a time-to-transition measurement, the RWL 1273 initially changes state, goes "high" in this example. In response to the RWL 1273 going high, the RBL 1203 reaches a predetermined threshold within the time window associated with the time delay $D_1$ for cases where the memory cell stores a voltage value $V_3$.

In response to the RBL 1203 reaching a predetermined threshold around time $t_1$, the output of the sense circuit, RBLD 1207 transitions low. The RBLD 1207 transitioning at time $t_{1.5}$ starts propagating through the delay line 1211 and the point of transition of the RBLD 1207 within the delay line is captured by a strobe clock signal firing around time $t_4$. The strobe clock signal firing around time $t_4$, is a delayed response to the firing of the strobe clock signal 1231.

The amount of time that has passed since the transition of the RBLD 1207 is correlated to a data value in the time-to-transition measurement. For example, given a time reference of $t_4$ (e.g., when the strobe clock signal 1233 fires), the time for when the RBLD 1207 transitions at time $t_{2.5}$ and propagates through the delay line is less than when the RBLD 1207 transitions at time $t_{1.5}$ and propagates through the delay line. Similarly, the time for when the RBLD 1207 transitions at time $t_{3.5}$ and propagates through the delay line is even less when compared to transitions occurring around times $t_{2.5}$ or $t_{1.5}$.

In this example the propagation of "0" is longest for time delay $D_1$, next longest for time delay $D_2$, and then for time delay $D_3$. In the case of RBL not transitioning, the output of the capture flip flop is all "1". The time delay $D_{DL}$ 1263 of the delay line 1211 may be chosen to be greater than or equal to the time difference between time $t_4$ and time $t_{1.5}$. Having a time delay DDL greater than the time difference between time $t_4$ and time $t_{1.5}$ provides a delay margin for RBLD transitioning at time $t_{1.5}$ and propagating through the delay line 1211.

The delay DDE 1265 of a delay element in the delay line 1211 may be uniform across all delay elements or may be non-uniform across all delay elements. In one embodiment the $D_{DE}$ may be in logarithmic incremental steps, where the delay of two successive delay elements increment logarithmically or decrement logarithmically. From the output of the capture flip flop a correlation to the logical value of the data stored in the memory cell 205 can be made. The correlation of the time-to-transition can be made to a voltage value in the memory cell 205 of FIG. 4*b* or an impedance value of a memory cell and in turn to the logical value of the data stored in stored.

Figure 13:
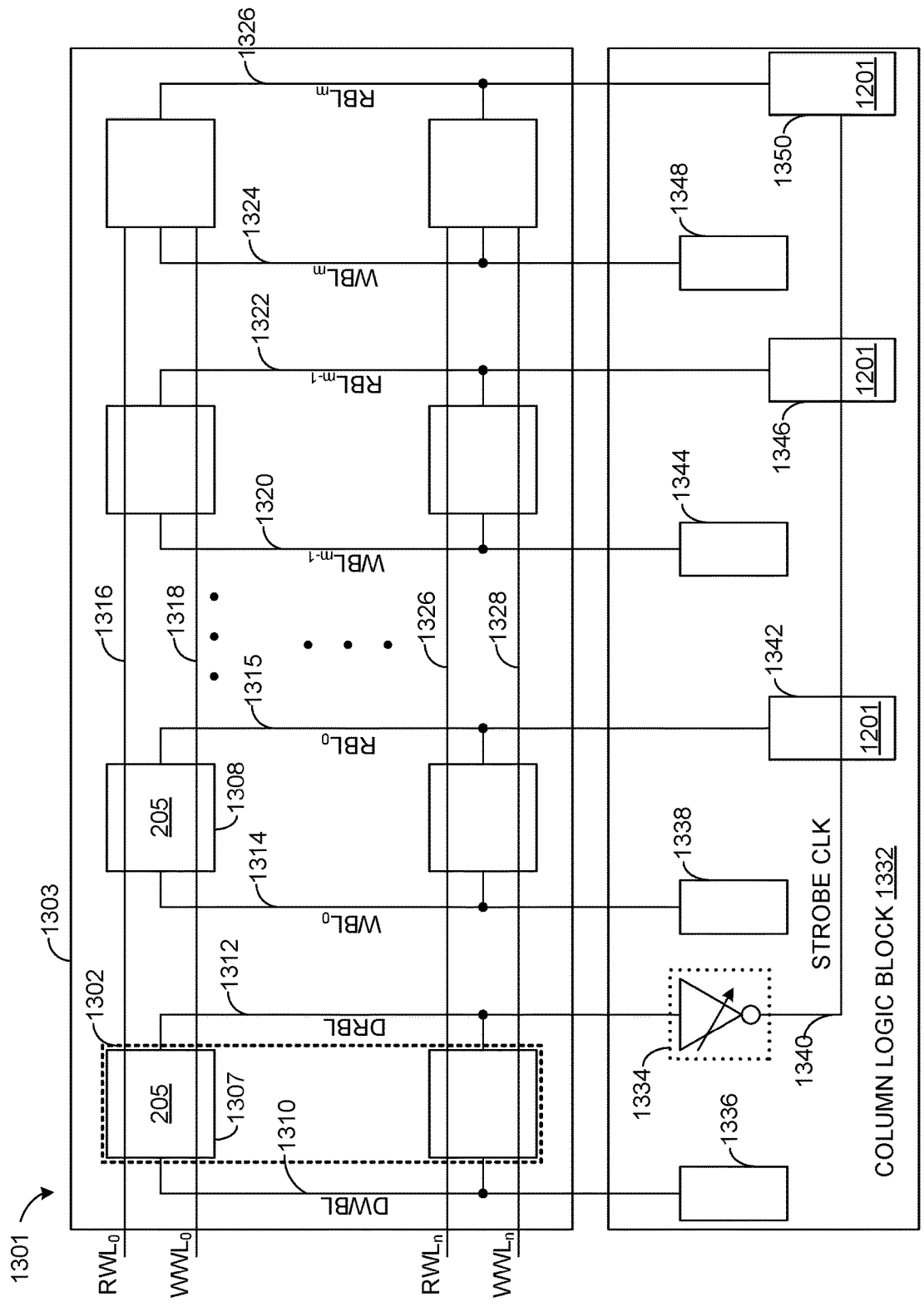
FIG. 13 shows, in block diagram form, a circuit in accordance with at least some embodiments.

FIG. 13 illustrates in block diagram form, a building block 1301 comprising a plurality of 3T DRAM bit cells, such as the 3T DRAM memory cell 205 described in FIG. 2. The building block 1301 is configured to use a single read operation to determine values in a plurality of memory cells. In one embodiment, the building block 1301 reads the plurality of memory cells in a manner described herein, and generates a combined value comprising the several value of the plurality of memory cells.

The building block 1301 comprises a two dimensional memory array 1303 and a column logic block 1332. The two dimensional memory array 1303 comprises a plurality of memory cells. In this example, the plurality of memory cells are 3T DRAM memory cells, such as memory cell 205 described in FIG. 2. The memory cells define one or more rows such as word lines $RWL_0$ 1316, ..., $RWL_n$ 1326, and $WWL_0$ 1318, ..., $WWL_n$ 1328 and one or more columns such as bit lines DWBL 1310, DRBL 1312, $WBL_0$ 1314, ..., $WBL_{m-1}$ 1320, $WBL_m$ 1324, $RBL_0$ 1315, ..., $RBL_{m-1}$ 1322, and $RBL_m$ 1326. The row and column designations are interchangeable between the word lines and bit lines. The word lines and bit lines are orthogonal with respect to each other.

In the memory array 1301, one of the columns of the memory cells is defined as a tracking block 1302. An example tracking cell 1307 is illustrated in the tracking block 1302. In this example the tracking memory cell 1307 is illustrated for each row of memory cells. In another embodiment one tracking cell may be implemented for the entire array of bit cells.

The column logic block 1332 comprises one or more column write logics 1336, 1338, 1344, and 1348, and time-to-transition measurement circuits 1342, 1346, and 1350, where the time-to-transition measurement circuits are similar to the time-to-transition measurement circuit 1201 discussed in FIG. 12. The column logic block 1332 also comprises an adjustable delay element 1334. The adjustable delay elements 1334 is coupled to the tracking memory block 1302. During operation of the building block 1301, the strobe clock signal 1340 for the time-to-transition measurement circuit 1342, 1346, and 1350 is driven by the adjustable delay element 1334 and in this example, it is an inverter with adjustable delay.

During operation of the building block 1301, various values are read out by the column logic block 1332. In some embodiments, the column logic block 1332 is configured to determine several values using one read operations and providing an output equal to a combination of several values, referred to herein as a "combined value". In other embodiments, the column logic block 1332 is configured to determine several values simultaneously to provide a combined value.

With respect to the possible voltage values that may be stored in a memory cell, FIGS. 4a and 4b illustrate possible values as a bell curve. Each bell curve captures a potential distribution of voltage values that may correspond to a respective logical value stored in the memory cell 205.

In FIG. 13, the tracking memory cell 1307 stores a predetermined threshold based on the possible voltage values that may be stored by a memory cell in the memory array 1303. For example, if the memory cell 205 is configured to store four possible voltage values $V_0$, $V_1$, $V_2$, and $V_3$, the tracking cell 1307 may store either $V_1$, $V_2$, or $V_3$ as a predetermined threshold.

In one example where the memory cell 205 can store four different values, the tracking cell 1307 is configured to store a predetermined threshold that tracks the voltage $V_3$. In another example where the memory cell 205 can store eight different values, the tracking cell 1307 is configured to store a predetermined threshold that tracks the voltage $V_7$. In these examples, the tracking cell 1307 is configured to store voltage values representing a higher possible value that may be stored by the memory cells in the memory array. The voltage values $V_3$ and $V_7$ are the higher voltage value being stored. In another example, the tracking cell 1307 is configured to store a voltage value that tracks with memory cells having larger delays. For example, the tracking cell 1307 may store a voltage value such as $V_1$ (where the memory cells can store 4 or 8 different values). Accordingly, the tracking cells is not limited to storing only the higher possible voltage values. Prior to a read operation, the relevant voltage value may be programmed into the tracking cell.

In response to $RWL_0$ 1316 going high, the DRBL 1312 coupled to the output of the memory cell 1307 reaches a predetermined threshold around time $t_1$. The time $t_1$ correlates with the time delay $D_1$ (e.g., a time-to-transition determination) as discussed in FIGS. 4a and 4b. In response to the DRBL 1312 reaching the predetermined threshold time, the adjustable delay element 1334 coupled to DRBL 1312 couples the strobe clock signal 1340 to the time-to-transition measurement circuits 1342, 1346, and 1350. The strobe clock signal 1340 fires after time $t_1$. Each time-to-transition measurement circuit 1342, 1346, and 1350 is coupled to a respective read bit line $RBL_0$ 1315, $RBL_{m-1}$ 1322, and $RBL_m$ 1326.

The output of memory cells 205 coupled to the read word line $RWL_0$ 1316 are correlated to a voltage value and in turn to a logical data value with respect to the tracking memory cell 1307. The output of a tracking cell in tracking column or block 1302 provides a time reference value. A time-to-transition measurement with respect to a tracking cell in tracking column 1302 is used to correlate the voltage value and in turn to a logical value for all the other memory cells coupled to the same read word line coupled to the tracking cell in the tracking column 1302.

Figure 14:
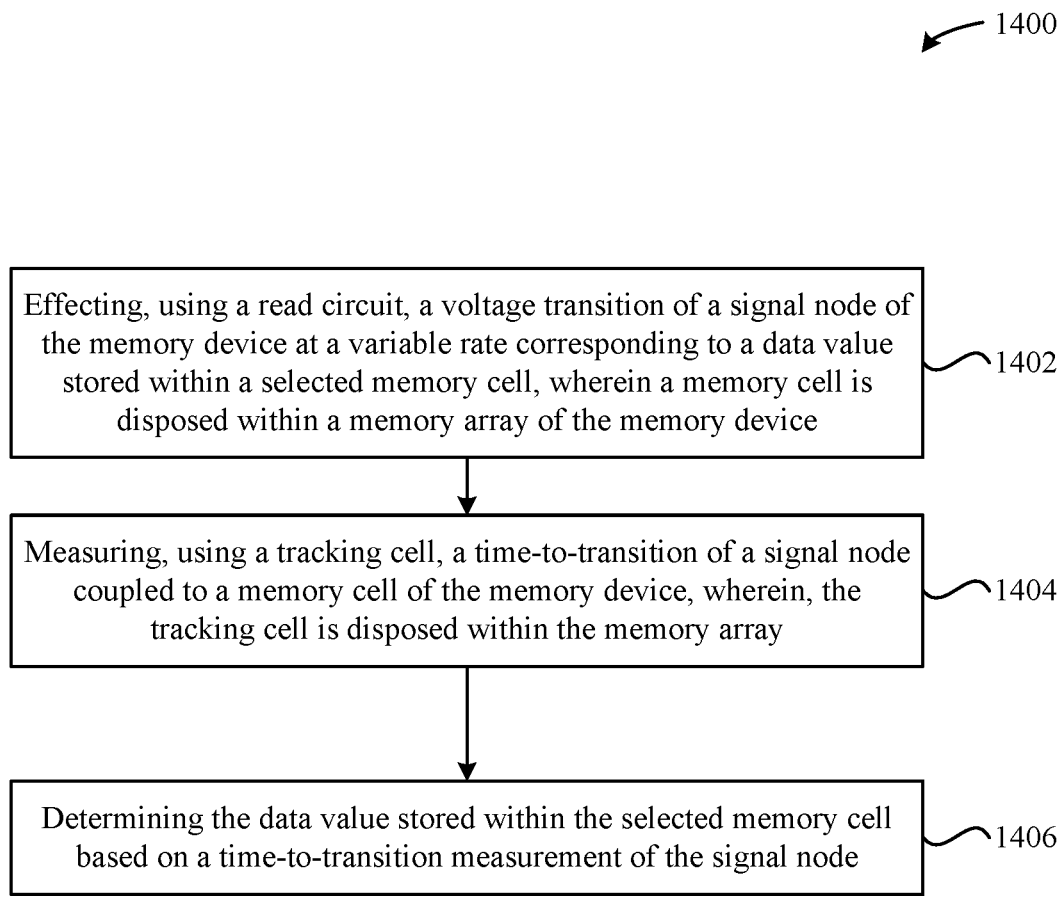
FIG. 14 illustrates a method of reading a memory, in accordance with at least some embodiments.

FIG. 14 illustrates a method for reading a memory, according to some embodiments. As shown, the method begins at step 1402, where a read circuit effects a voltage transition of a signal node of the memory device at a variable rate corresponding to a data value stored within a selected memory cell, where a memory cell is disposed within a memory array of the memory device.

At step 1404, a tracking cell is used to measure a time-to-transition of a signal node coupled to a memory cell of the memory device, where the tracking cell is disposed within the memory array. At step 1406, a determination is made as to the data value stored within the selected memory cell based on a time-to-transition measurement of the signal node.

As can be appreciated, many of the embodiments described herein incorporate a memory cell having an impedance that varies in accordance with the data value stored therein (i.e., a variable impedance memory cell). The data value is read from the memory cell based upon a variable time delay of a related circuit node (i.e., signal node), for example, a bit line, a read bit line, etc. In some embodiments, a signal node is discharged at a rate that varies in accordance with the data value stored in the memory cell, and the time for that signal node to discharge to a particular value can be measured, and the data value inferred from that time-to-discharge measurement. Such time-to-discharge read techniques can be utilized with many types of memory circuits, as noted herein, and particularly to volatile and non-volatile memory technologies, including PN Junction memory devices, resistive memory devices, magnetoresistive memory devices, and spin-torque memory devices, and further including memory devices based upon silicon, carbon (e.g., carbon nanotubes), or other non-silicon semiconductor materials. In addition, the teachings herein regarding time-to-discharge read techniques and corresponding circuits may also be applied to analogous time-to-charge read techniques and corresponding circuits, such as, for example, in an embodiment having a P-type transistor whose source terminal is coupled to an upper power supply node instead of an N-type transistor whose source terminal is coupled to a lower power supply node. Consequently, such time-to-discharge and time-to-charge techniques and embodiments described herein may collectively be viewed as "time-to-transition" techniques in which a circuit (e.g., a read circuit, a memory cell selection circuit, etc.), effects a voltage transition of one node (e.g., a signal node) at a variable rate corresponding to the voltage of another node. In various embodiments, the signal node can be a bit line, a read bit line, and/or other suitable circuit node. In some embodiments, such a technique includes determining a variable time delay of a signal node voltage change corresponding to a variable impedance of a selected memory cell or other functional circuit. In some embodiments, such a technique includes determining a variable time delay of a signal node voltage change corresponding to the voltage of a first node that results from a first circuit coupling a signal value onto the first node. In some embodiments the first circuit can be a memory cell, such as a 1TDRAM memory cell. In some embodiments the first circuit can be a function circuit.

In some of the embodiments described above, a calibration operation, such as a calibration time-to-transition measurement, is performed before actually sensing data from a selected memory cell. Such a calibration operation can remove the effects of any offsets (e.g., comparator offset voltage, transistor mismatch, resistance mismatch, etc.) when reading a selected memory cell, because in a given data path the same offsets affect the calibration operation in the same fashion as they affect the read operation. This is particularly helpful with modern processes incorporating extremely scaled transistors operating at very low voltages.

Consistent with the above disclosure, the examples enumerated in the following clauses are specifically contemplated and are intended as a non-limiting set of examples.

Clause 1. A memory device comprising:
a memory array comprising:
a plurality of memory cells, each memory cell having an impedance that varies in accordance with a respective data value stored therein; and
a tracking memory cell having an impedance based on a tracking data value stored therein; and
a read circuit coupled to the memory array, the read circuit configured to:
determine an impedance of a selected memory cell with respect to the impedance of the tracking memory cell;
read a data value stored within the selected memory cell based upon a voltage change of a signal node corresponding to the impedance of the selected memory cell.

Clause 2. The memory device according to clause 1, wherein:
each respective data value corresponds to a plurality of bits.

Clause 3. The memory device according to any preceding clause, wherein:
the tracking data value of the tracking memory cell corresponds to one of a plurality of data values.

Clause 4. The memory device according to any preceding clause, wherein:
the impedance of the selected memory cell corresponds to a transistor within the selected memory cell, wherein a gate voltage of the transistor varies with a data written within the selected memory cell.

Clause 5. The memory device according to clause 4, wherein:
the plurality of memory cells comprises volatile memory cells.

Clause 6. The memory device according to clause 4, wherein:
the plurality of memory cells comprises non-volatile memory cells.

Clause 7. The memory device according to clause 4, wherein:
the selected memory cell comprises a second transistor having a gate voltage that varies with a data written within the selected memory cell; and
the transistor and the second transistor together, determine the impedance of the selected memory cell.

Clause 8. The memory device according to any preceding clause, wherein:
the signal node comprises a read bit line node.

Clause 9. The memory device according to any preceding clause, wherein:
the read circuit and the selection circuit, are configured to:
effect a change in voltage of the signal node at a variable rate corresponding to the impedance of the selected memory cell;
determine a time delay associated with the change in voltage of the signal node; and
read the data value stored within the selected memory cell based upon the time delay.

Clause 10. The memory device according to clause 9, wherein:
the read circuit is configured to:
discharge the signal node at a variable rate corresponding to the impedance of the selected memory cell;
determine the time delay associated with the change in voltage of the signal node based on a time-to-discharge measurement of the signal node, wherein the signal node comprises a read bit line node.

Clause 11. The memory device according to clause 9, wherein:
the read circuit is configured to:
charge the signal node at a variable rate corresponding to the impedance of the selected memory cell;
determine the time delay associated with the change in voltage of the signal node based on a time-to-charge measurement of the signal node;
wherein the signal node comprises a read bit line node.

Clause 12. The memory device according to any preceding clause, wherein the read circuit further comprises:
a time-to-discharge measurement circuit comprising:
an input coupled to the signal node; and
an output coupled to the delay line, wherein the input stage is configured to generate a timing signal that couples an output of the input stage, in response to the signal node reaching a predetermined threshold.

Clause 13. The memory device according to clause 12, wherein the time-to-discharge measurement circuit further comprises:
an input stage comprising:
an input coupled to the signal node; and
an output coupled to the delay line,
wherein the sense circuit is configured to:
determine the signal node as reached a predetermined threshold; and in response to the determination,
generate a timing signal; and
couple the timing signal to the delay line.

Clause 14. The memory device according to clause 13, wherein:
the signal node comprises a read bit line node; and
each respective data value corresponds to a plurality of bits.

Clause 15. A method if reading a memory device, comprising:
effecting, using a read circuit, a voltage transition of a signal node of the memory device at a variable rate corresponding to a data value stored within a selected memory cell; wherein a memory cell is disposed within a memory array of the memory device,
measuring, using a tracking cell, a time-to-transition of a signal node coupled to a memory cell of the memory device; wherein, the tracking cell is disposed within the memory array; and
determining the data value stored within the selected memory cell based on a time-to-transition measurement of the signal node.

Clause 16. The method of any preceding clause, wherein the data value corresponds to a plurality of bits.

Clause 17. The method of any preceding clause, further comprising, storing a tracking data value in the tracking cell prior to reading the memory device.

Clause 18. The method of any preceding clause, further comprising, comparing the time-to-transition measurement to a reference condition; wherein the reference condition is based on a time-to-transition measurement of the tracking cell.

Clause 19. The method of any preceding clause, wherein determining the data value stored within the selected memory cell based on a time-to-transition measurement of the signal node further comprises:
providing a strobe clock signal to a plurality of time-to-transition measurement circuits; wherein the strobe clock signal is provided by a delay element;

determining, in one read operation, a plurality of values of the memory array; and providing an output comprising a combination of the plurality of values of the memory array.

Clause 20. The method of any preceding clause, wherein determining the data value stored within the selected memory cell based on a time-to-transition measurement of the signal node further comprises, capturing states of a delay line at one or more time intervals defined by coupling one or more strobe clock signals.

References to "one embodiment", "an embodiment", "some embodiments", "various embodiments", or the like indicate that a particular element or characteristic is included in at least one embodiment of the invention. Although the phrases may appear in various places, the phrases do not necessarily refer to the same embodiment or example.

Regarding terminology used herein, many of the node names and signal names include subscripts to better distinguish between distinct instantiations of similar nodes and signals (e.g., $WL_0$ and $WL_1$), as such usage is well understood in the art. Nevertheless, any inadvertent use herein without such subscript is not intended to imply any difference relative to a subscripted version of the same name (e.g., Vbias and $V_{bias}$) unless the context clearly requires such. In addition, any use herein of a term including a lower case portion thereof is not intended to imply any difference relative to an upper case version of the same name (e.g., $V_{TH}$ and $V_{th}$) unless the context clearly requires such.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high," and "circuit 10 drives OUT high." Such shorthand phrases for describing circuit operation used herein are more efficient to communicate details of circuit operation, particularly because the schematic diagrams in the figures clearly associate various signal names with the corresponding circuit blocks and nodes. For convenience, and otherwise unnamed node conveying the CLK signal may be referred to as the CLK node. Similarly, phrases such as "pull high." "drive high," and "charge" are generally synonymous unless otherwise distinguished, as are the phrases "pull low," "drive low," and "discharge." It is believed that use of these more concise descriptive expressions enhances clarity and teaching of this disclosure. It is to be appreciated by those skilled in the art that each of these and other similar phrases may be interchangeably used to describe common circuit operation, and no subtle inferences should be read into varied usage within this description.

An insulated gate field effect transistor (IGFET) may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is frequently symmetrical (which is typically not the case for bipolar transistors). For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". The source and drain terminals may also be referred to as conduction electrodes. Such a description is equally valid for a P-channel IGFET transistor, since the polarity between drain and source voltages, and the direction of current flow between drain and source, is not implied by such terminology. Alternatively, one current-handling terminal may be arbitrarily deemed the "drain" and the other deemed the "source", with an implicit understanding that the two are not distinct, but interchangeable. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOS and MOSFET should not be interpreted to literally refer to only a metal gate FET having an oxide dielectric.

Regarding power supplies, a single positive power supply voltage (e.g., a 2.5 volt power supply) used to power a circuit is frequently named the "$V_{DD}$" power supply. In an integrated circuit, transistors and other circuit elements are actually connected to a $V_{DD}$ terminal or a $V_{DD}$ node, which is then operably connected to the $V_{DD}$ power supply. The colloquial use of phrases such as "tied to $V_{DD}$" or "connected to $V_{DD}$" is understood to mean "connected to the $V_{DD}$ node", which is typically then operably connected to actually receive the $V_{DD}$ power supply voltage during use of the integrated circuit. The reference voltage for such a single power supply circuit is frequently called "$V_{SS}$." Transistors and other circuit elements are actually connected to a $V_{SS}$ terminal or a $V_{SS}$ node, which is then operably connected to the $V_{SS}$ power supply during use of the integrated circuit. Frequently the $V_{SS}$ terminal is connected to a ground reference potential, or just "ground." Describing a node which is "grounded" by a particular transistor or circuit (unless otherwise defined) means the same as being "pulled low" or "pulled to ground" by the transistor or circuit.

Generalizing somewhat, the first power supply terminal is frequently named "$V_{DD}$", and the second power supply terminal is frequently named "$V_{SS}$." Historically the nomenclature "$V_{DD}$" implied a DC voltage connected to the drain terminal of an MOS transistor and $V_{SS}$ implied a DC voltage connected to the source terminal of an MOS transistor. For example, legacy PMOS circuits used a negative $V_{DD}$ power supply, while legacy NMOS circuits used a positive $V_{DD}$ power supply. Common usage, however, frequently ignores this legacy and uses $V_{DD}$ for the more positive supply voltage and $V_{SS}$ for the more negative (or ground) supply voltage unless, of course, defined otherwise. Describing a circuit as functioning with a "$V_{DD}$ supply" and "ground" does not necessarily mean the circuit cannot function using other power supply potentials. Other common power supply terminal names are "$V_{CC}$" (a historical term from bipolar circuits and frequently synonymous with a +5 volt power supply voltage, even when used with MOS transistors which lack collector terminals) and "GND" or just "ground."

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While the disclosed devices and techniques have been described in light of the embodiments discussed above, one skilled in the art will also recognize that certain substitutions may be easily made in the circuits without departing from the teachings of this disclosure. Also, many circuits using NMOS transistors may be implemented using PMOS transistors instead, as is known in the art, provided the logic polarity and power supply potentials are reversed. In this vein, the transistor conductivity type (i.e., N-channel or P-channel) within a CMOS circuit may be frequently reversed while still preserving similar or analogous operation. Moreover, implementation of the disclosed devices and techniques is not necessarily limited to CMOS technology, and thus implementations utilizing NMOS, PMOS, and various bipolar or other semiconductor fabrication technologies are also contemplated, including PN junction memory devices and nanotube devices.

The various techniques, structures, and methods described above are contemplated to be used alone as well as in various combinations. The above discussion is meant to be illustrative of the principles and various embodiments of the present invention, and it should be understood that the drawings and detailed description herein are to be regarded in an illustrative rather than a restrictive manner, and are not intended to be limiting to the particular forms and examples disclosed. Numerous variations and modifications will become apparent to those skilled in the art once the above disclosure is fully appreciated. It is intended that the following claims be interpreted to embrace all such variations and modifications.

What is claimed is:

1. A memory device comprising:
   a memory array comprising:
      a plurality of memory cells, each memory cell having an impedance that varies in accordance with a respective data value stored therein, and wherein each respective data value corresponds to a plurality of bits; and
      one or more tracking memory cells, each tracking memory cell having an impedance based on a respective tracking data value stored therein; and
   a read circuit coupled to the memory array, the read circuit configured to:
      receive output from a selected memory cell of the plurality of memory cells and from a selected tracking memory cell of the one or more tracking memory cells;
      determine an impedance of the selected memory cell with reference to the impedance of the selected tracking memory cell; and
      determine, using a single memory read access and based on the impedance of the selected memory cell, the respective data value stored in the selected memory cell, wherein the respective data value can be any one of all the possible data values corresponding to the plurality of bits.

2. The memory device according to claim 1, wherein each row of the memory array has a tracking memory cell associated with the row.

3. The memory device according to claim 1, wherein the respective tracking data value of the selected tracking memory cell corresponds to one of a plurality of data values.

4. The memory device according to claim 1, wherein the impedance of the selected memory cell corresponds to a transistor within the selected memory cell, wherein a gate voltage of the transistor varies with data written within the selected memory cell.

5. The memory device according to claim 4, wherein the plurality of memory cells comprises volatile memory cells.

6. The memory device according to claim 4, wherein the plurality of memory cells comprises non-volatile memory cells.

7. The memory device according to claim 4, wherein the selected memory cell comprises a second transistor having a gate voltage that varies with data written within the selected memory cell, and the transistor and the second transistor, together, determine the impedance of the selected memory cell.

8. The memory device according to claim 1, wherein the signal node comprises a read bit line node.

9. The memory device according to claim 1, further comprising a selection circuit, wherein the read circuit and the selection circuit are configured to:
   effect a change in voltage of the signal node at a variable rate corresponding to the impedance of the selected memory cell;
   determine a time delay associated with the change in voltage of the signal node; and
   read the data value stored within the selected memory cell based upon the time delay.

10. The memory device according to claim 9, wherein the read circuit is configured to:
    discharge the signal node at a variable rate corresponding to the impedance of the selected memory cell;
    determine the time delay associated with the change in voltage of the signal node based on a time-to-discharge measurement of the signal node, wherein the signal node comprises a read bit line node.

11. The memory device according to claim 9, wherein the read circuit is configured to:
    charge the signal node at a variable rate corresponding to the impedance of the selected memory cell;
    determine the time delay associated with the change in voltage of the signal node based on a time-to-charge measurement of the signal node, wherein the signal node comprises a read bit line node.

12. The memory device of claim 1, wherein the read circuit further comprises:
    a time-to-discharge measurement circuit comprising:
       an input coupled to the signal node; and
       a delay line defining a plurality of delay stages, wherein each delay stage is coupled to a respective one of a plurality of registers that are responsive to a common strobe clock.

13. The memory device according to claim 12, wherein the time-to-discharge measurement circuit further comprises:

a sense circuit comprising:
an input coupled to the signal node; and
an output coupled to the delay line, wherein the sense circuit is configured to:
determine the signal node has reached a predetermined threshold; and in response to the determination,
generate a timing signal; and
couple the timing signal to the delay line.

14. The memory device according to claim 13, wherein the signal node comprises a read bit line node, and wherein each respective data value corresponds to a plurality of bits.

15. A method of reading a memory device, comprising:
effecting, using a read circuit, a voltage transition of a signal node of the memory device at a variable rate corresponding to a respective data value stored within a selected memory cell, wherein the selected memory cell is disposed within a memory array of the memory device, and wherein the respective data value corresponds to a plurality of bits;
measuring, using an individual tracking memory cell, a time-to-transition of a signal node coupled to the selected memory cell, wherein the individual tracking memory cell is disposed within the memory array;
determining, based on the time-to-transition of the signal node coupled to the selected memory cell, an impedance of the selected memory cell; and
determining, using a single memory read access and based on the impedance of the selected memory cell, the respective data value stored in the selected memory cell, wherein the respective data value can be any one of all possible data values corresponding to the plurality of bits.

16. The method of claim 15, wherein the memory device comprises a memory array, and wherein each row of the memory array has a respective tracking memory cell associated with the row.

17. The method of claim 15, further comprising storing a tracking data value in the individual tracking memory cell prior to reading the memory device.

18. The method of claim 15, further comprising, comparing the time-to-transition measurement to a reference condition, wherein the reference condition is based on a time-to-transition measurement of the individual tracking memory cell.

19. The method of claim 15, further comprising:
providing a strobe clock signal to a plurality of time-to-transition measurement circuits, wherein the strobe clock signal is provided by a delay element;
determining, in one read operation, a plurality of values of the memory array; and
providing an output comprising a combination of the plurality of values of the memory array.

20. The method of claim 15, further comprising capturing states of a delay line at one or more time intervals defined by coupling one or more strobe clock signals.

* * * * *